United States Patent
Obu et al.

(10) Patent No.: US 11,164,963 B2
(45) Date of Patent: Nov. 2, 2021

(54) BIPOLAR TRANSISTOR AND RADIO-FREQUENCY POWER AMPLIFIER MODULE

(71) Applicant: Murata Manufacturing Co., Ltd., Kyoto-fu (JP)

(72) Inventors: Isao Obu, Nagaokakyo (JP); Yasunari Umemoto, Nagaokakyo (JP); Masahiro Shibata, Nagaokakyo (JP); Shigeki Koya, Nagaokakyo (JP); Masao Kondo, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 16 days.

(21) Appl. No.: 16/854,262

(22) Filed: Apr. 21, 2020

(65) Prior Publication Data

US 2020/0251579 A1    Aug. 6, 2020

Related U.S. Application Data

(63) Continuation of application No. 16/125,234, filed on Sep. 7, 2018, now Pat. No. 10,665,704.

(30) Foreign Application Priority Data

Sep. 15, 2017 (JP) ................. 2017-177619

(51) Int. Cl.
*H01L 29/737* (2006.01)
*H03F 3/21* (2006.01)
(Continued)

(52) U.S. Cl.
CPC ...... *H01L 29/7371* (2013.01); *H01L 21/0217* (2013.01); *H01L 21/02271* (2013.01);
(Continued)

(58) Field of Classification Search
CPC ... H01L 29/73-7371; H01L 29/66234-66242; H01L 29/66318;
(Continued)

(56) References Cited

U.S. PATENT DOCUMENTS

| 4,789,643 A | 12/1988 | Kajikawa |
| 7,256,433 B2 | 8/2007 | Kurokawa et al. |

(Continued)

FOREIGN PATENT DOCUMENTS

| JP | 2000-260783 A | 9/2000 |
| JP | 2001-308103 A | 11/2001 |
| JP | 2003-347307 A | 12/2003 |

OTHER PUBLICATIONS

Koichi Kamon et al.; "Selective Embedded Growth of AlxGa1-xAs by Low-Pressure Organometallic Vapor Phase Epitaxy"; Japanese Journal of Applied Physics; Jan. 1986; pp. L10-L12; vol. 25, No. 1.

*Primary Examiner* — Sonya McCall-Shepard
(74) *Attorney, Agent, or Firm* — Studebaker & Brackett PC

(57) ABSTRACT

A bipolar transistor includes a collector layer, a base layer, and an emitter layer that are formed in this order on a compound semiconductor substrate. The emitter layer is disposed inside an edge of the base layer in plan view. A base electrode is disposed on partial regions of the emitter layer and the base layer so as to extend from an inside of the emitter layer to an outside of the base layer in plan view. An insulating film is disposed between the base electrode and a portion of the base layer, with the portion not overlapping the emitter layer. An alloy layer extends from the base electrode through the emitter layer in a thickness direction and reaches the base layer. The alloy layer contains at least one element constituting the base electrode and elements constituting the emitter layer and the base layer.

20 Claims, 29 Drawing Sheets

(51) Int. Cl.
  H03F 1/56     (2006.01)
  H03F 3/24     (2006.01)
  H01L 29/08    (2006.01)
  H01L 23/00    (2006.01)
  H01L 29/10    (2006.01)
  H01L 29/417   (2006.01)
  H01L 29/423   (2006.01)
  H01L 21/306   (2006.01)
  H01L 21/02    (2006.01)
  H01L 21/311   (2006.01)
  H01L 21/308   (2006.01)
  H01L 29/66    (2006.01)
  H03F 3/213    (2006.01)
  H03F 3/195    (2006.01)
  H01L 29/205   (2006.01)
  H01L 29/45    (2006.01)
  H03F 1/30     (2006.01)
  H01L 27/102   (2006.01)
  H01L 21/285   (2006.01)

(52) U.S. Cl.
  CPC ...... *H01L 21/28575* (2013.01); *H01L 21/308* (2013.01); *H01L 21/30612* (2013.01); *H01L 21/31111* (2013.01); *H01L 24/00* (2013.01); *H01L 29/0813* (2013.01); *H01L 29/0817* (2013.01); *H01L 29/0826* (2013.01); *H01L 29/1004* (2013.01); *H01L 29/205* (2013.01); *H01L 29/41708* (2013.01); *H01L 29/42304* (2013.01); *H01L 29/66318* (2013.01); *H03F 1/56* (2013.01); *H03F 3/195* (2013.01); *H03F 3/211* (2013.01); *H03F 3/213* (2013.01); *H03F 3/245* (2013.01); *H01L 29/452* (2013.01); *H03F 1/302* (2013.01); *H03F 2200/222* (2013.01); *H03F 2200/267* (2013.01); *H03F 2200/318* (2013.01); *H03F 2200/387* (2013.01); *H03F 2200/451* (2013.01)

(58) Field of Classification Search
  CPC ........... H01L 29/1004; H01L 29/42304; H01L 29/0817; H01L 29/41708; H01L 29/6634; H01L 24/00; H01L 21/30612; H01L 21/0217; H01L 21/02271; H01L 21/28575; H01L 21/31111; H01L 21/308; H01L 2224/13147; H01L 2224/131; H01L 24/13; H01L 24/03; H01L 24/11; H01L 2224/05548; H01L 24/05; H01L 2224/1147; H01L 2224/05644; H01L 2224/0345; H01L 2224/0401; H01L 2924/13051; H01L 27/1022
  See application file for complete search history.

(56) References Cited

U.S. PATENT DOCUMENTS

| | | |
|---|---|---|
| 2001/0046747 A1 | 11/2001 | Shinozaki et al. |
| 2002/0153536 A1 | 10/2002 | Hirata et al. |
| 2004/0041235 A1 | 3/2004 | Yanagihara et al. |
| 2005/0110045 A1 | 5/2005 | Ishigaki et al. |
| 2008/0230807 A1 | 9/2008 | Kuroda et al. |

BIPOLAR TRANSISTOR AND RADIO-FREQUENCY POWER AMPLIFIER MODULE

CROSS-REFERENCE TO RELATED APPLICATIONS

This application is a Continuation of U.S. patent application Ser. No. 16/125,234, filed Sep. 7, 2018, which claims benefit of priority to Japanese Patent Application No. 2017-177619, filed Sep. 15, 2017, the entire content of which is incorporated herein by reference.

BACKGROUND

Technical Field

The present disclosure relates to a bipolar transistor and a radio-frequency power amplifier module.

Background Art

Currently, mobile communication systems typified by cellular phone terminals are to be transferred from the fourth generation (4G) to the fifth generation (5G). In the fifth-generation mobile communication systems, a frequency band higher than that in the fourth-generation mobile communication systems is also used. Therefore, a further increase in the speed of semiconductor devices has been desired.

One of main components of a cellular phone terminal is a radio-frequency power amplifier module. In general, the radio-frequency power amplifier module includes a compound semiconductor device. A heterojunction bipolar transistor (HBT), which has good characteristics such as high linearity operation, high efficiency operation, and high current density operation, is generally used as the compound semiconductor device.

Japanese Unexamined Patent Application Publication No. 2000-260783 discloses an HBT having good process controllability and capable of being operated at a high speed. The HBT includes a sub-collector layer, a collector layer, a base layer, an emitter layer, and an emitter cap layer that are formed by sequentially stacking on one surface of a semi-insulating GaAs substrate so as to have predetermined shapes. An inner end portion of a base electrode overlaps a peripheral edge of the emitter layer, and the base electrode is electrically connected to the base layer with an alloy layer formed by an alloying treatment of the emitter layer located under the base electrode. The emitter layer is selectively formed on the base layer, the base electrode extends from a peripheral edge portion of the emitter layer to the base layer, and the alloy layer extends to an intermediate point of the base layer in a thickness direction. An edge of the base layer is located inside an outer edge of the base electrode.

Since the edge of the base layer is located inside the outer edge of the base electrode, the junction area between the base and the collector becomes smaller than that in the structure in which the edge of the base layer is located outside the outer edge of the base electrode. This structure decreases a radio-frequency feedback capacitance (base-collector capacitance). As a result, an increase in the speed of the HBT can be realized.

SUMMARY

To further increase the speed of a bipolar transistor such as an HBT, it is effective to decrease the transit time of electrons in a base layer by reducing the thickness of the base layer. However, in the structure disclosed in Japanese Unexamined Patent Application Publication No. 2000-260783, it was found to be difficult to make the thickness of the base layer smaller than a certain lower limit.

Accordingly, the present disclosure provides a bipolar transistor having a structure that can increase the speed by reducing the thickness of a base layer. Another object of the present disclosure is to provides a radio-frequency power amplifier module including the bipolar transistor.

According to a preferred embodiment of the present disclosure, a bipolar transistor includes a collector layer formed on a substrate made of a compound semiconductor, a base layer formed on the collector layer, an emitter layer formed on the base layer and disposed inside an edge of the base layer in plan view, and a base electrode disposed on partial regions of the emitter layer and the base layer so as to extend from an inside of the emitter layer to an outside of the base layer in plan view. The bipolar transistor further includes an insulating film disposed between the base electrode and a portion of the base layer, the portion not overlapping the emitter layer, and an alloy layer that extends from the base electrode through the emitter layer in a thickness direction and reaches the base layer and that contains at least one element constituting the base electrode and elements constituting the emitter layer and the base layer.

The insulating film disposed between the base layer and the base electrode prevents alloying due to reaction between the base electrode and the base layer. Therefore, direct diffusion of an element constituting the base electrode into the base layer is prevented, and the element diffuses into the base layer through the emitter layer. As a result, the alloy layer has a small penetration depth in the base layer, and thus the thickness of the base layer can be reduced. The reduction in the thickness of the base layer enables the speed to be increased.

A side face of an upper portion of the collector layer may be continuous with a side face of the base layer, and a side face of a remaining lower portion of the collector layer, may be located outside the side face of the base layer.

The structure of the bipolar transistor in which the base electrode reaches the outside of the edge of the base layer in plan view can be realized by, for example, subjecting the base layer to side-etching using the base electrode as an etching mask. During the side etching of the base layer, an upper portion of the collector layer is removed by etching. The remaining lower portion of the collector layer can be etched separately from the step of side etching. Thus, the amount of side etching can be determined without depending on the thickness of the collector layer.

The collector layer may include an intermediate collector layer that is disposed at an intermediate position in the thickness direction and made of a semiconductor material having etching characteristics different from etching characteristics of a semiconductor material of another portion, a side face of an upper portion of the collector layer disposed on the intermediate collector layer may be continuous with a side face of the base layer, and a side face of a lower portion of the collector layer disposed under the intermediate collector layer may be located outside the side face of the base layer.

When the base layer and the collector layer are etched by using the base electrode as an etching mask, the etching in the depth direction can be stopped by the intermediate collector layer. Subsequently, the base layer and an upper portion of the collector layer disposed on the intermediate collector layer are subjected to side-etching. Thus, the amount of side etching can be controlled independently from the amount of etching in the thickness direction.

The bipolar transistor may further include a sub-collector layer disposed between the substrate and the collector layer and functioning as a path of a current that flows into and out of the collector layer, in which the sub-collector layer includes a first sub-collector layer disposed on the substrate and a second sub-collector layer disposed on the first sub-collector layer, and the second sub-collector layer has etching characteristics different from etching characteristics of a portion of the collector layer, the portion being in contact with the second sub-collector layer. In etching of the collector layer, the second sub-collector layer can be used as an etching stopper. Accordingly, process controllability can be enhanced.

The bipolar transistor may further include a contact layer disposed on a partial region of the emitter layer and functioning as a path of a current that flows into and out of the emitter layer, and an emitter electrode disposed on the contact layer and projecting outward from an edge of the contact layer, in which a leading end of a projecting portion of the emitter electrode coincides with an edge of the base electrode in plan view. For example, when the base electrode is formed by vapor deposition, the base electrode can be formed in a self-aligned manner with respect to the emitter electrode. The contact layer may include a plurality of semiconductor layers arranged on an upper surface of the emitter layer in an in-plane direction, and the base electrode may include a portion disposed between the plurality of semiconductor layers that form the contact layer.

A plurality of semiconductor layers that form the contact layer and the base electrodes on both sides of the contact layer operate as one bipolar transistor (unit bipolar transistor). The arrangement of a plurality of semiconductor layers that form the contact layer and the arrangement of the base electrodes between the semiconductor layers provide a circuit in which a plurality of unit bipolar transistors are substantially connected in parallel.

The bipolar transistor may further include a plurality of emitter electrodes connected to the emitter layer and arranged in an in-plane direction, in which the base electrode includes a portion disposed between the emitter electrodes. Each of the emitter electrodes and the base electrodes on both sides of the emitter electrode operate as one bipolar transistor (unit bipolar transistor). The arrangement of the base electrodes between respective adjacent emitter electrodes provides a circuit in which a plurality of unit bipolar transistors are substantially connected in parallel.

The substrate, the collector layer, and the base layer may include a layer made of GaAs, the emitter layer may be made of InGaP, the insulating film may include a layer made of SiN, and the at least one element constituting the base electrode and contained in the alloy layer may be Pt. The alloy layer is formed by reaction between Pt and InGaP and between Pt and GaAs. The insulating film made of SiN prevents the formation of the alloy layer due to reaction between the base electrode and the base layer in a region where the emitter layer is not provided.

According to another preferred embodiment of the present disclosure, a radio-frequency power amplifier module includes an amplifying IC including a bipolar transistor and a control IC that controls operation of the bipolar transistor. In the radio-frequency power amplifier module, the amplifying IC includes a collector formed on a substrate made of a compound semiconductor, a base layer formed on the collector layer, an emitter layer formed on the base layer and disposed inside an edge of the base layer in plan view, a base electrode disposed on partial regions of the emitter layer and the base layer so as to extend from an inside of the emitter layer to an outside of the base layer in plan view, an insulating film disposed between the base electrode and a portion of the base layer, the portion not overlapping the emitter layer, and an alloy layer that extends from the base electrode through the emitter layer in a thickness direction and reaches the base layer and that contains at least one element constituting the base electrode and elements constituting the emitter layer and the base layer.

As in the bipolar transistor according to the preferred embodiment of the present disclosure, an increase in the speed of a bipolar transistor can be realized. As a result, an increase in the speed can be realized in a radio-frequency power amplifier module.

The insulating film disposed between the base layer and the base electrode prevents alloying due to reaction between the base electrode and the base layer. Therefore, direct diffusion of an element constituting the base electrode into the base layer is prevented, and the element diffuses into the base layer through the emitter layer. As a result, the alloy layer has a small penetration depth in the base layer, and thus the thickness of the base layer can be reduced. The reduction in the thickness of the base layer enables the speed of the bipolar transistor to be increased. The use of this bipolar transistor realizes an increase in the speed of a radio-frequency power amplifier module.

Other features, elements, characteristics and advantages of the present disclosure will become more apparent from the following detailed description of preferred embodiments of the present disclosure with reference to the attached drawings.

DETAILED DESCRIPTION

First Embodiment

A heterojunction bipolar transistor (HBT) according to a first embodiment will be described with reference to FIGS. 1A to 3B.

Figure 1A:
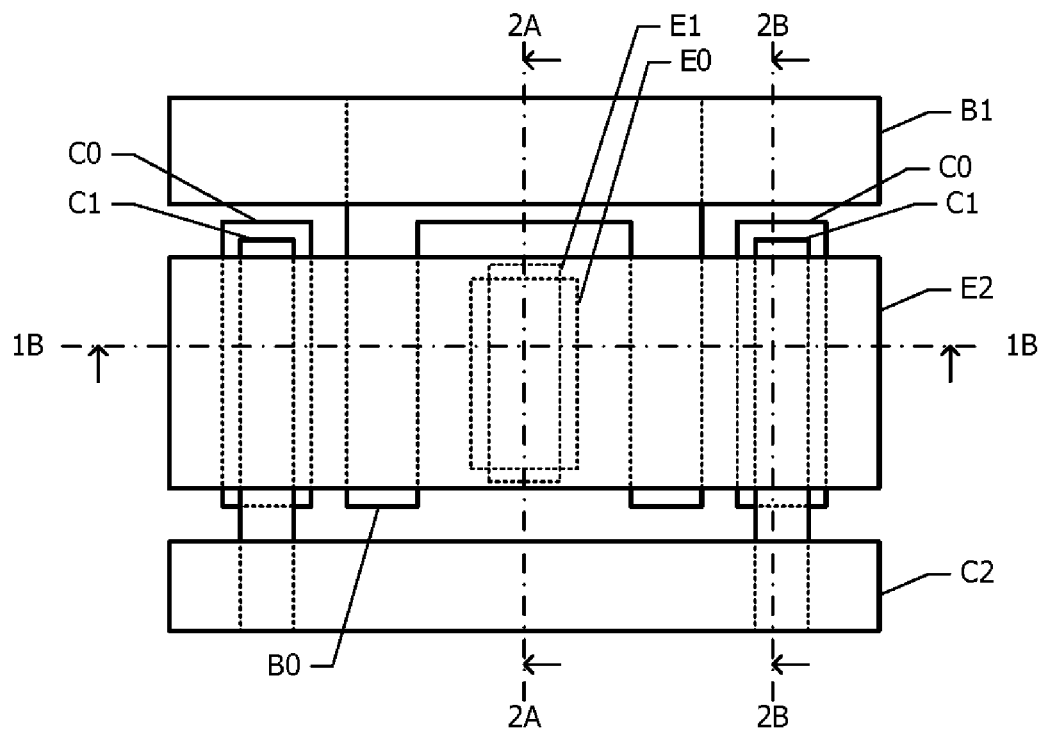
FIG. 1A is a plan view of electrodes connected to a collector, a base, and an emitter of an HBT and wiring lines disposed thereon, according to a first embodiment.

FIG. 1A is a plan view of electrodes connected to a collector, a base, and an emitter of an HBT and wiring lines disposed thereon, according to the first embodiment. Portions of a base electrode B0 are disposed on both sides of an emitter electrode E0, and the portions of the base electrode B0 on both sides of the emitter electrode E0 are continuous with each other on a side of the emitter electrode E0 (the upper side in FIG. 1A). Specifically, the base electrode B0 has a U shape (horseshoe shape) that surrounds the emitter electrode E0 from three directions (the left, the right, and the top in FIG. 1A) in plan view. Collector electrodes C0 are disposed on both sides of the emitter electrode E0 with the base electrode B0 therebetween. Specifically, the base electrode B0 is disposed between the emitter electrode E0 and each of the collector electrodes C0.

A first-layer emitter wiring line E1 overlaps the emitter electrode E0 and is connected to the emitter electrode E0. A second-layer emitter wiring line E2 extends in a direction in which the emitter electrode E0, the base electrode B0, and the collector electrodes C0 are arranged (hereinafter, referred to as an "electrode arrangement direction") and partially overlaps the base electrode B0 and the collector electrodes C0. The second-layer emitter wiring line E2 is connected to the first-layer emitter wiring line E1 in a region where the second-layer emitter wiring line E2 overlaps the first-layer emitter wiring line E1. Each of the planar shapes of the emitter electrode E0 and the pair of collector electrodes C0 is a rectangle, and the long sides of the rectangle are orthogonal to the electrode arrangement direction.

A pair of first-layer collector wiring lines C1 partially overlaps the pair of collector electrodes C0, respectively, and is lead, in a direction orthogonal to the electrode arrangement direction, to regions where the first-layer collector wiring lines C1 do not overlap the second-layer emitter wiring line E2. Each of the first-layer collector wiring lines C1 is connected to the corresponding collector electrode C0 in a region where the first-layer collector wiring line C1 overlaps the collector electrode C0. A second-layer collector wiring line C2 is disposed on a side of the second-layer emitter wiring line E2 (the lower side in FIG. 1A), and the second-layer collector wiring line C2 is connected to the pair of first-layer collector wiring lines C1.

A first-layer base wiring line B1 is disposed on the side opposite to the second-layer collector wiring line C2 with respect to the second-layer emitter wiring line E2 and extends in the electrode arrangement direction. The first-layer base wiring line B1 partially overlaps the base electrode B0 and is connected to the base electrode B0 in the overlapping region.

Figure 1B:
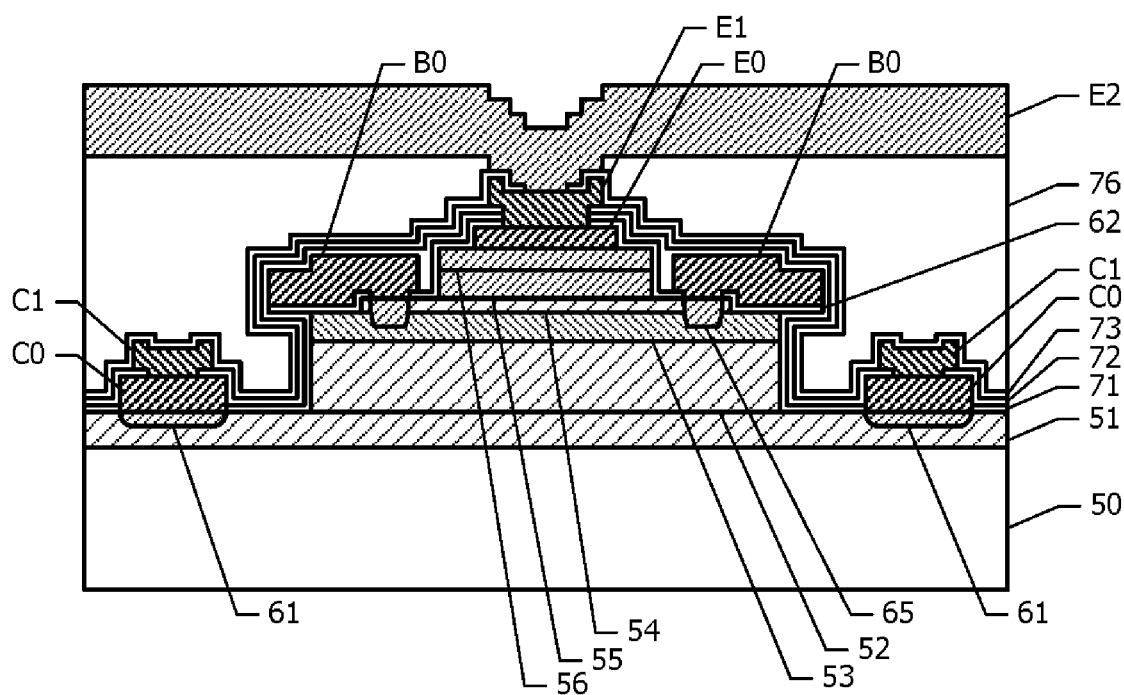
FIG. 1B is a sectional view of the HBT taken along dash-dotted line 1B-1B in FIG. 1A.

FIG. 1B is a sectional view of the HBT taken along dash-dotted line 1B-1B in FIG. 1A. A sub-collector layer 51 is disposed on a substrate 50. A collector layer 52 and a base layer 53 are stacked on a partial region of the sub-collector layer 51 in this order. An emitter layer 54 is disposed on the base layer 53. The emitter layer 54 is disposed inside the edge of the base layer 53 in plan view. Therefore, a region where the emitter layer 54 is not provided is present from the edge of the base layer 53 toward the inside.

A first contact layer 55 and a second contact layer 56 are stacked on a partial region of the emitter layer 54 in this order. The first contact layer 55 and the second contact layer 56 are disposed inside the edge of the emitter layer 54 in plan view.

The substrate 50 is made of, for example, semi-insulating GaAs. The sub-collector layer 51 is made of, for example, n-type GaAs having a Si doping concentration of $5\times10^{18}$ $cm^{-3}$ and has a film thickness of 600 nm. The collector layer 52 is made of, for example, n-type GaAs having a Si doping concentration of $1\times10^{16}$ $cm^{-3}$ and has a film thickness of 1,000 nm. The base layer 53 is made of, for example, p-type GaAs having a C doping concentration of $5\times10^{19}$ $cm^{-3}$ and has a film thickness of 50 nm. The emitter layer 54 is made of, for example, n-type InGaP having a molar ratio of InP of 0.48 and a Si doping concentration of $4\times10^{17}$ $cm^{-3}$ and has a film thickness of 35 nm. The first contact layer 55 is made of, for example, n-type GaAs having a Si doping concentration of $5\times10^{18}$ $cm^{-3}$ and has a film thickness of 50 nm. The second contact layer 56 is made of, for example, n-type InGaAs having a molar ratio of InAs of 0.5 and a Si doping concentration of $1\times10^{19}$ cm$^{-3}$ and has a film thickness of 50 nm.

Collector electrodes C0 are disposed on the sub-collector layer 51 on both sides of the collector layer 52. Each of the collector electrodes C0 has a multilayer metal structure in which a AuGe film having a thickness of 60 nm, a Ni film having a thickness of 10 nm, and a Au film having a thickness of 200 nm are stacked in this order. The AuGe film, which is the lowermost layer, is in contact with the sub-collector layer 51, and a collector electrode alloy layer 61 is formed at the interface between the collector electrode C0 and the sub-collector layer 51 by reaction between AuGe and the sub-collector layer 51. The collector electrode alloy layer 61 provides ohmic electrical connection between the collector electrode C0 and the sub-collector layer 51. The sub-collector layer 51 functions as a path of a current that flows into and out of the collector layer 52.

A base electrode B0 is disposed on the emitter layer 54 on both sides of the first contact layer 55. The base electrode B0 extends from the top of the emitter layer 54 through a region between the edge of the emitter layer 54 and the edge of the base layer 53 to the outside of the edge of the base layer 53. Thus, the base electrode B0 includes an eaves-shaped portion projecting outward from the edge of the base layer 53. An insulating film 62 is disposed between the base electrode B0 and a portion of the base layer 53, the portion not overlapping the emitter layer 54.

The base electrode B0 has a multilayer metal structure in which a Pt film having a thickness of 20 nm, a Ti film having a thickness of 50 nm, a Pt film having a thickness of 50 nm, and a Au film having a thickness of 200 nm are stacked in this order. The Pt film which is the lowermost layer is in contact with the emitter layer 54, and a base electrode alloy layer 65 is formed by reaction between Pt and the emitter layer 54 and between Pt and the base layer 53. The base electrode alloy layer 65 extends through the emitter layer 54 in a thickness direction and reaches the base layer 53. The base electrode alloy layer 65 provides ohmic electrical connection between the base electrode B0 and the base layer 53. The base electrode alloy layer 65 contains at least one element constituting the base electrode B0 and elements constituting the emitter layer 54 and the base layer 53. The emitter layer 54 in a region between the inside edge (inner edge) of the base electrode B0 and the edge of the first contact layer 55 is depleted.

An emitter electrode E0 is disposed on a partial region of the second contact layer 56. The emitter electrode E0 has a multilayer metal structure in which a Mo film having a thickness of 10 nm, a Ti film having a thickness of 5 nm, a Pt film having a thickness of 30 nm, and a Au film having a thickness of 200 nm are stacked in this order. The Mo film, which is the lowermost layer, is in contact with the second contact layer 56. The emitter electrode E0 is electrically connected to the emitter layer 54 with the second contact layer 56 and the first contact layer 55 therebetween.

The insulating film 62 disposed between the base layer 53 and the base electrode B0 covers the layered structure from the emitter layer 54 to the emitter electrode E0. The base electrode B0 is in contact with the emitter layer 54 through an opening formed in the insulating film 62.

On the upper surface of the sub-collector layer 51, a region other than regions where the collector electrodes C0 are disposed is covered with an interlayer insulating film 71. The interlayer insulating film 71 covers a layered structure from the collector layer 52 to the second contact layer 56, the base electrode B0, and the emitter electrode E0. An interlayer insulating film 72 is disposed so as to cover the interlayer insulating film 71 and the collector electrodes C0.

First-layer collector wiring lines C1 are disposed on the collector electrodes C0. Each of the first-layer collector wiring lines C1 is connected to the corresponding collector electrode C0 through an opening provided in the interlayer insulating film 72. A first-layer emitter wiring line E1 is disposed on the emitter electrode E0. The first-layer emitter wiring line E1 is connected to the emitter electrode E0 through an opening provided in the insulating film 62, the interlayer insulating film 71, and the interlayer insulating film 72. An interlayer insulating film 73 is disposed so as to cover the interlayer insulating film 72, the first-layer collector wiring lines C1, and the first-layer emitter wiring line E1.

The first-layer collector wiring lines C1, the first-layer emitter wiring line E1, and a first-layer base wiring line B1 (FIG. 1A) are each formed of, for example, a Au film having a thickness of 1 μm. The insulating film 62 and the interlayer insulating films 71, 72, and 73 are made of, for example, SiN. The insulating film 62 may be made of an insulating material such as SiON or SiO. The insulating film 62 has a thickness of, for example, 50 nm. The interlayer insulating films 71, 72, and 73 each have a thickness of, for example, 200 nm.

A planarizing insulating film 76 is formed on the interlayer insulating film 73. The planarizing insulating film 76 is made of, for example, a polyimide, and a portion thereof having the largest thickness has a thickness of, for example, 4 μm. The upper surface of the planarizing insulating film 76 is substantially flat.

A second-layer emitter wiring line E2 and a second-layer collector wiring line C2 (FIG. 1A) are disposed on the planarizing insulating film 76. The second-layer emitter wiring line E2 is connected to the first-layer emitter wiring line E1 through an opening provided in the planarizing insulating film 76 and the interlayer insulating film 73. The second-layer emitter wiring line E2 and the second-layer collector wiring line C2 (FIG. 1A) are made of, for example, Au and has a thickness of, for example, 4 μm.

Figure 2A:
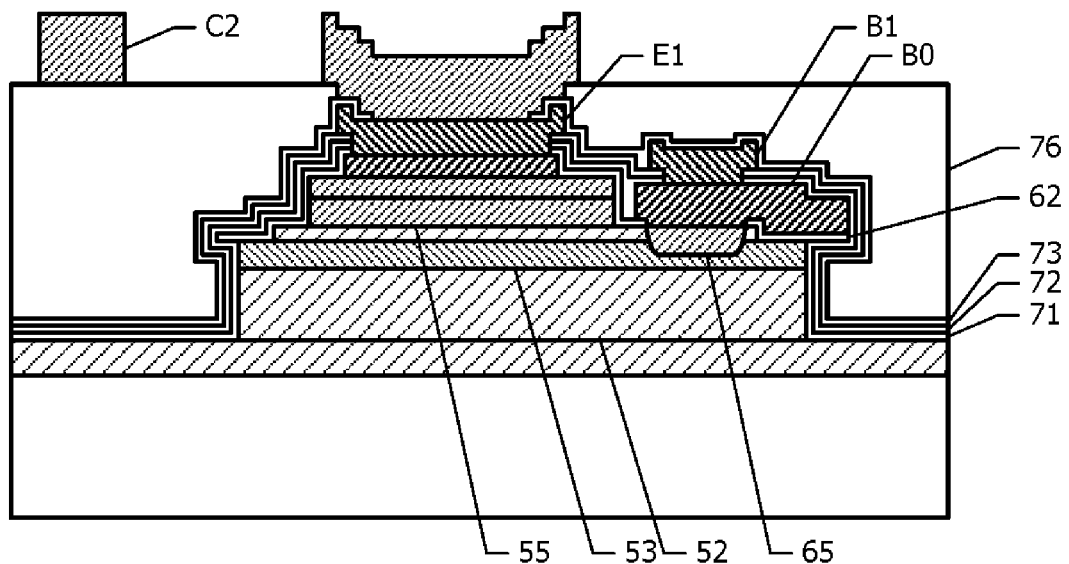
FIGS. 2A and 2B are sectional views of the HBT taken along dash-dotted lines 2A-2A and 2B-2B, respectively, in FIG. 1A.

FIG. 2A is a sectional view of the HBT taken along dash-dotted line 2A-2A in FIG. 1A. The section illustrated in FIG. 2A includes a section of a portion of the base electrode B0 having a U shape in plan view, the portion being located on the side opposite to the opening. In the section illustrated in FIG. 2A, the base electrode B0 is similarly connected to the base layer 53 with the base electrode alloy layer 65 therebetween. The insulating film 62 is disposed between the base electrode B0 and the base layer 53 as in the section illustrated in FIG. 1B. The outside edge (outer edge) of the base electrode B0 projects outward from the edge of the collector layer 52 and the base layer 53 as in the section illustrated in FIG. 1B.

A first-layer base wiring line B1 is disposed on the base electrode B0 with the interlayer insulating films 71 and 72 therebetween. The base wiring line B1 is connected to the base electrode B0 through an opening provided in the interlayer insulating films 71 and 72. The first-layer base wiring line B1 is covered with the interlayer insulating film 73 as in the first-layer emitter wiring line E1. The second-layer collector wiring line C2 is disposed on the planarizing insulating film 76 covering the interlayer insulating film 73.

Figure 2B:
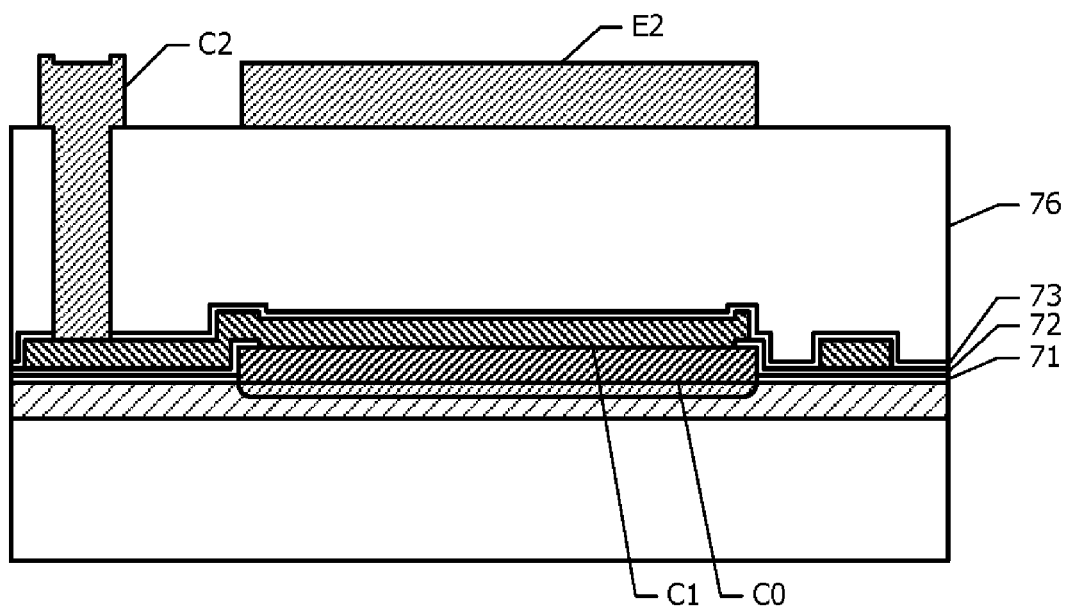

FIG. 2B is a sectional view of the HBT taken along dash-dotted line 2B-2B in FIG. 1A. A first-layer collector wiring line C1 is disposed on a collector electrode C0 with the interlayer insulating films 71 and 72 therebetween. The first-layer collector wiring line C1 is connected to the collector electrode C0 through an opening provided in the interlayer insulating films 71 and 72. The first-layer collector wiring line C1 extends to a region where the collector electrode C0 is not provided.

The second-layer collector wiring line C2 and the emitter wiring line E2 are disposed on the planarizing insulating film 76. The second-layer collector wiring line C2 is connected to a portion of the first-layer collector wiring line C1 through an opening provided in the planarizing insulating film 76 and the interlayer insulating film 73, the portion being located in the region where the collector electrode C0 is not provided.

Next, advantageous effects of the HBT according to the first embodiment will be described with reference to FIGS. 3A and 3B in comparison with a reference example.

Figure 3A:
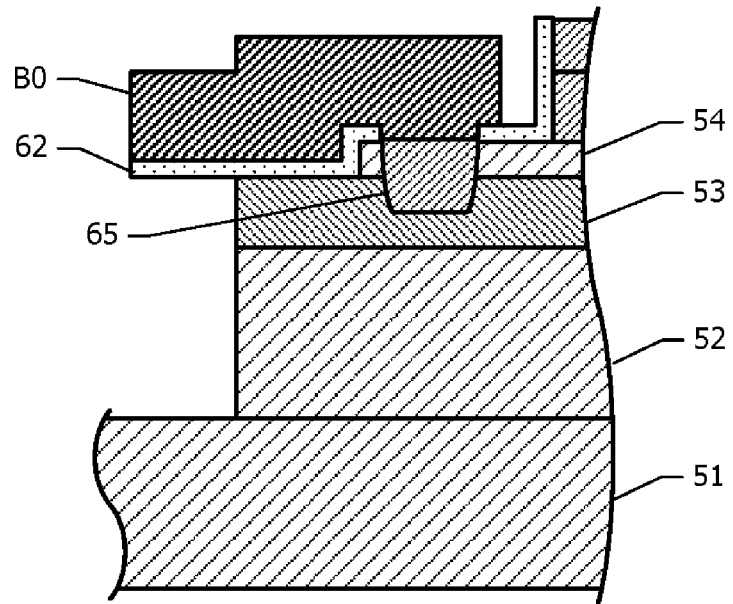
FIGS. 3A and 3B are partial sectional views of HBTs according to the first embodiment and a reference example, respectively.

FIG. 3A is a partial sectional view of the HBT according to the first embodiment. An emitter layer 54 is disposed on a partial region of a base layer 53. The edge of the emitter layer 54 is located inside the edge of the base layer 53. An insulating film 62 is disposed on the emitter layer 54 and a portion of the base layer 53, the portion being located between the edge of the base layer 53 and the edge of the emitter layer 54. A base electrode B0 is disposed on the insulating film 62. The inner edge (the edge on the right side in FIG. 3A) of the base electrode B0 is located inside the edge of the emitter layer 54, and the outer edge (the edge on the left side in FIG. 3A) of the base electrode B0 is located outside the edge of the base layer 53. The insulating film 62 also projects outward from the edge of the base layer 53 as in the base electrode B0 and covers the lower surface of the base electrode B0. The position of the leading end of the projecting portion of the insulating film 62 substantially coincides with the position of the outer edge of the base electrode B0.

An opening is provided in the insulating film 62 disposed between the emitter layer 54 and the base electrode B0. The base electrode B0 is in contact with the emitter layer 54 through the opening. A base electrode alloy layer 65 is formed in a region where the base electrode B0 is in contact with the emitter layer 54. The base electrode alloy layer 65 extends through the emitter layer 54 in the thickness direction and reaches the base layer 53 but does not reach the collector layer 52. Since the insulating film 62 is disposed in a region between the edge of the emitter layer 54 and the edge of the base layer 53, the base electrode alloy layer 65 is not formed in this region. The insulating film 62 has a function of preventing alloying.

Figure 3B:
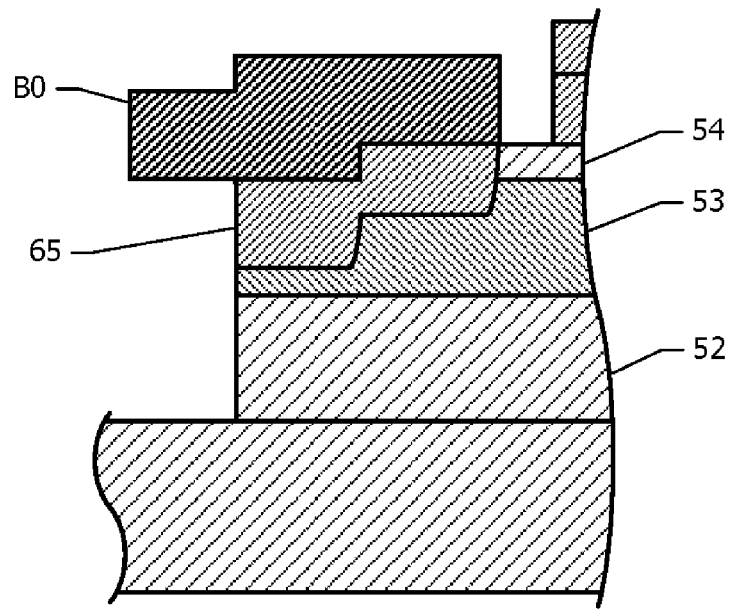

FIG. 3B is a partial sectional view of an HBT according to a reference example. In this reference example, the insulating film 62 in FIG. 3A is not provided. Therefore, a base electrode B0 is in direct contact with a base layer 53. As a result, a base electrode alloy layer 65 is formed also in a region of the base layer 53 where an emitter layer 54 is not provided.

The thickness of the base electrode alloy layer 65 must be larger than the thickness of the emitter layer 54 so that the base electrode alloy layer 65 extends through the emitter layer 54 and reaches the base layer 53. This condition must be satisfied in both the first embodiment illustrated in FIG. 3A and the reference example illustrated in FIG. 3B.

In the reference example illustrated in FIG. 3B, in addition to the above condition, the thickness of the base layer 53 must be larger than the thickness of the base electrode alloy layer 65 so that the base electrode alloy layer 65 does not reach a collector layer 52. The thickness of the base electrode alloy layer 65 (the depth of alloying) depends on the thickness of a Pt film which is the lowermost layer of the base electrode B0. In general, the thickness of the base electrode alloy layer 65 becomes about 2.5 times the thickness of the Pt film. Accordingly, the thickness of the base layer 53 must be larger than 2.5 times the thickness of the Pt film of the base electrode B0.

In contrast, in the first embodiment illustrated in FIG. 3A, the total thickness of the emitter layer 54 and the base layer 53 may be larger than 2.5 times the thickness of the Pt film of the base electrode B0. When the thickness of the Pt film is excessively small, Pt is deposited in the form of islands, and a film covering the entire surface of an underlying layer is not formed. For this reason, a suitable range of the thickness of the Pt film has a lower limit. A possible range of the thickness of the base electrode alloy layer 65 also has a lower limit. In the reference example illustrated in FIG. 3B, it is not preferable to make the thickness of the base layer 53 smaller than the lower limit of the thickness of the base electrode alloy layer 65.

In contrast, in the first embodiment illustrated in FIG. 3A, the total thickness of the emitter layer 54 and the base layer 53 may be larger than the lower limit of the thickness of the base electrode alloy layer 65. Therefore, the thickness of the base layer 53 can be made smaller than the thickness of the base electrode alloy layer 65.

In the first embodiment, the thickness of the base layer 53 can be made smaller than that in the reference example illustrated in FIG. 3B, as described above. The decrease in the thickness of the base layer 53 reduces the transit time of electrons in the base layer 53 to realize high-speed operation of the HBT.

Furthermore, in the first embodiment, the edge of the junction interface between the base layer 53 and the collector layer 52 is located inside the outer edge of the base electrode B0. With this structure, patterning can be performed while extending the outer edge of the base electrode B0 to the outside of the edge of the base-collector junction interface. Therefore, an advantageous effect of improving process controllability is also provided. The decrease in the area of the base-collector junction interface decreases a radio-frequency feedback capacitance (base-collector capacitance). As a result, an increase in the speed can be realized.

Next, a method for producing an HBT according to the first embodiment will be described with reference to FIGS. 4A to 9C. FIGS. 4A to 9C each correspond to the section of the HBT during its production in FIG. 1B.

Figure 4A:
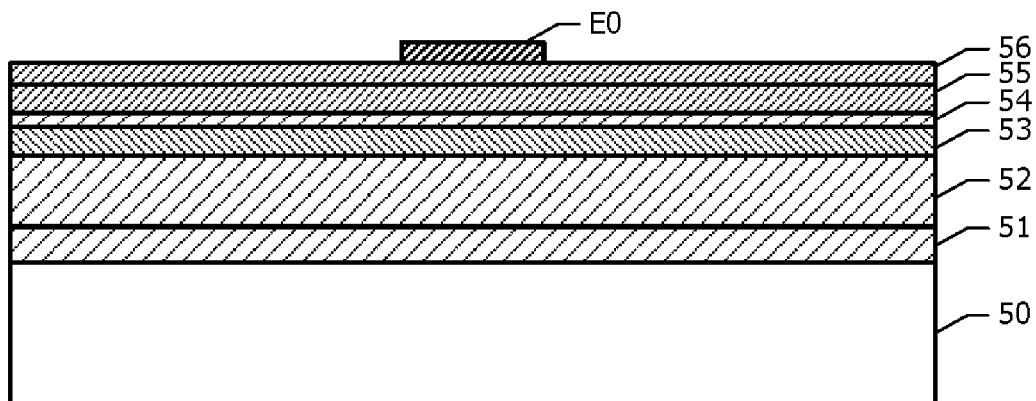
FIGS. 4A, 4B, and 4C are sectional views of an HBT according to the first embodiment during its production.

As illustrated in FIG. 4A, semiconductor layers including a sub-collector layer 51 to a second contact layer 56 are grown on a semi-insulating GaAs substrate 50 having a thickness of about 650 μm. These semiconductor layers can be grown by using, for example, metalorganic vapor phase epitaxy (MO-VPE). The surface of the substrate 50 has a crystal plane orientation in a range of, for example, (001) ±4°.

An emitter electrode E0 is formed on a partial region of the second contact layer 56. The emitter electrode E0 can be formed by, for example, vacuum evaporation and a lift-off method.

Figure 4B:
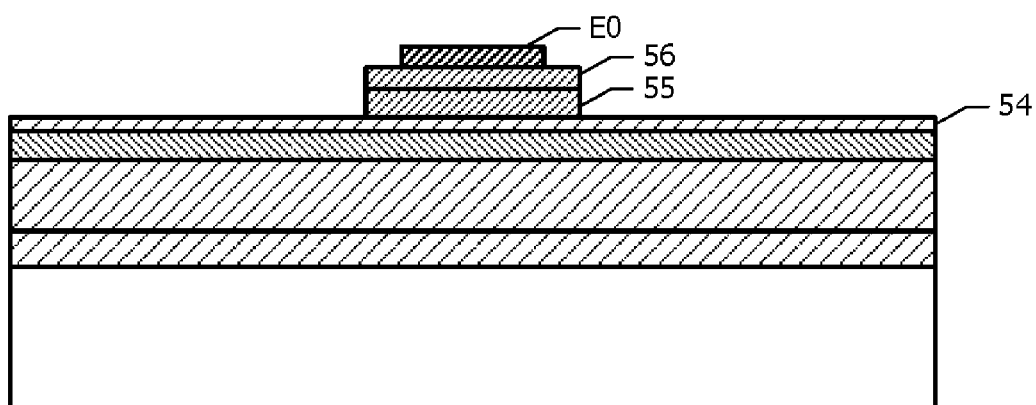

As illustrated in FIG. 4B, unnecessary regions of the second contact layer 56 and the first contact layer 55 are removed by etching. This etching may be, for example, wet etching using an etchant prepared by mixing phosphoric acid having a concentration of 85% by weight, a hydrogen peroxide solution having a concentration of 35% by weight, and water in a volume ratio of 1:2:40. Hereinafter, this etchant having this mixing ratio is simply referred to as a "phosphoric acid hydrogen peroxide mixed liquid". This etchant has such an etching selectivity that etching stops at the time when the emitter layer 54 made of InGaP is exposed.

Figure 4C:
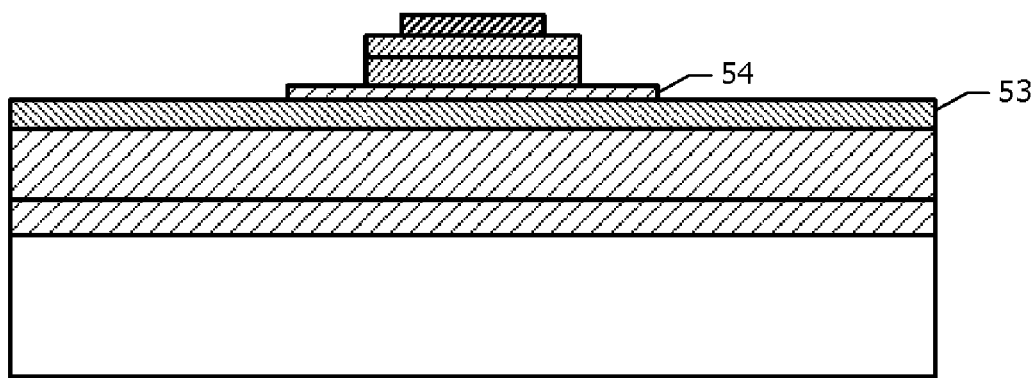

As illustrated in FIG. 4C, an unnecessary region of the emitter layer 54 is removed by etching. This etching may be, for example, wet etching using hydrochloric acid. Hydrochloric acid has such an etching selectivity that etching stops at the time when the base layer 53 made of GaAs is exposed.

Figure 5A:
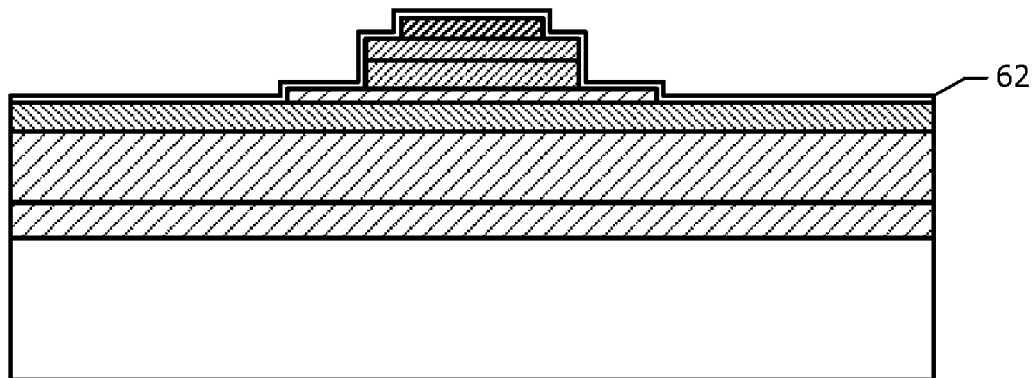
FIGS. 5A, 5B, and 5C are sectional views of an HBT according to the first embodiment during its production.
Figure 5B:
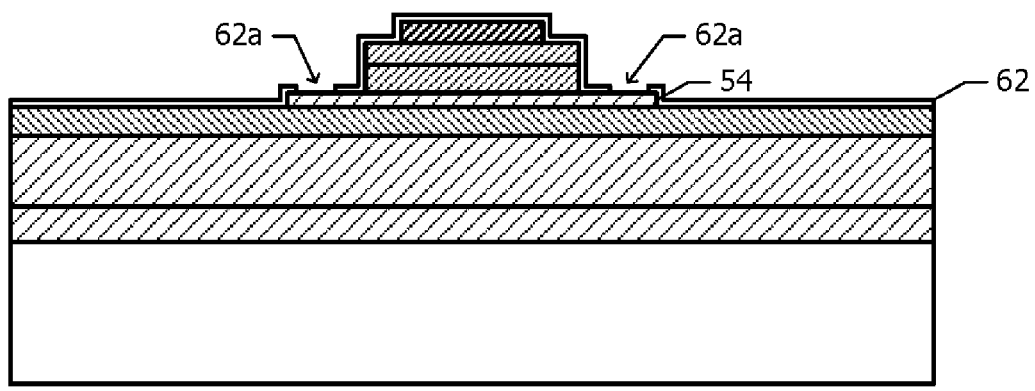

As illustrated in FIG. 5A, an insulating film 62 made of SiN is deposited over the entire region of the exposed surface by chemical vapor deposition (CVD). As illustrated in FIG. 5B, an opening 62a for exposing a portion of the upper surface of the emitter layer 54 is formed in the insulating film 62.

Figure 5C:
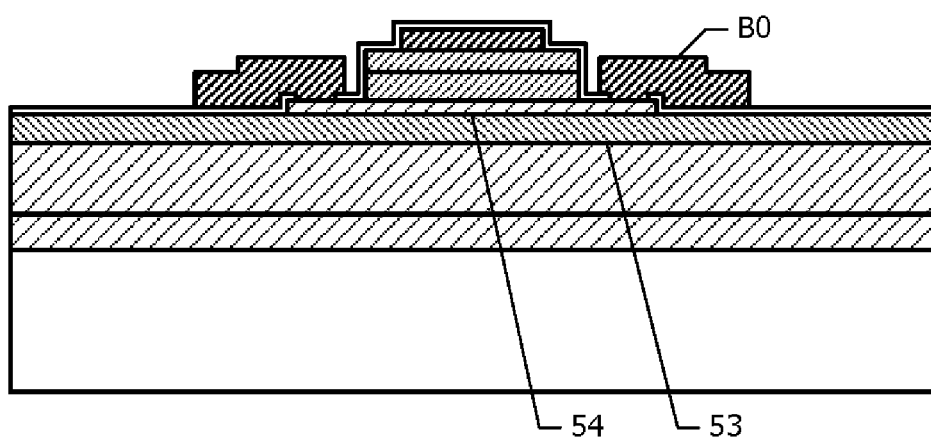

As illustrated in FIG. 5C, a base electrode B0 is formed by vacuum evaporation and a lift-off method. The base electrode B0 has the planar shape illustrated in FIG. 1A. The base electrode B0 is in contact with the emitter layer 54 through the opening 62a (FIG. 5B). The base electrode B0 is not in contact with the emitter layer 54 and the base layer 53 in a region where the opening 62a (FIG. 5B) is not formed.

Figure 6A:
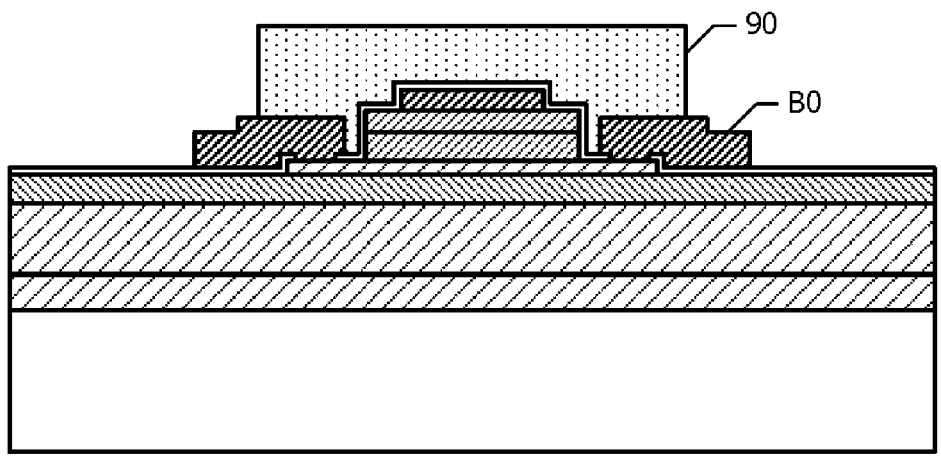
FIGS. 6A, 6B, and 6C are sectional views of an HBT according to the first embodiment during its production.

As illustrated in FIG. 6A, a photoresist film 90 is formed. The edge of the photoresist film 90 is located outside the inner edge of the base electrode B0 and inside the outer edge of the base electrode B0.

Figure 6B:
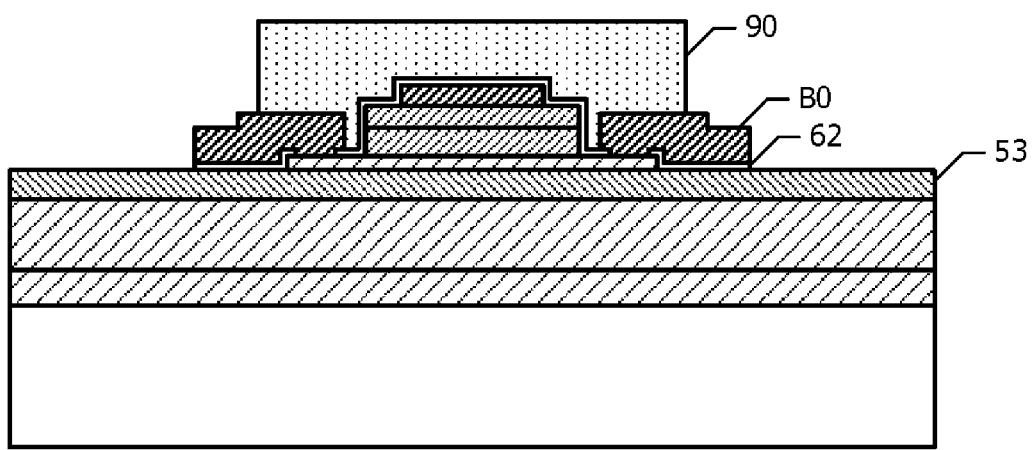

As illustrated in FIG. 6B, an exposed portion of the insulating film 62 is removed by etching using the photoresist film 90 and the base electrode B0 as an etching mask. The insulating film 62 is left between the base electrode B0 and the base layer 53.

Figure 6C:
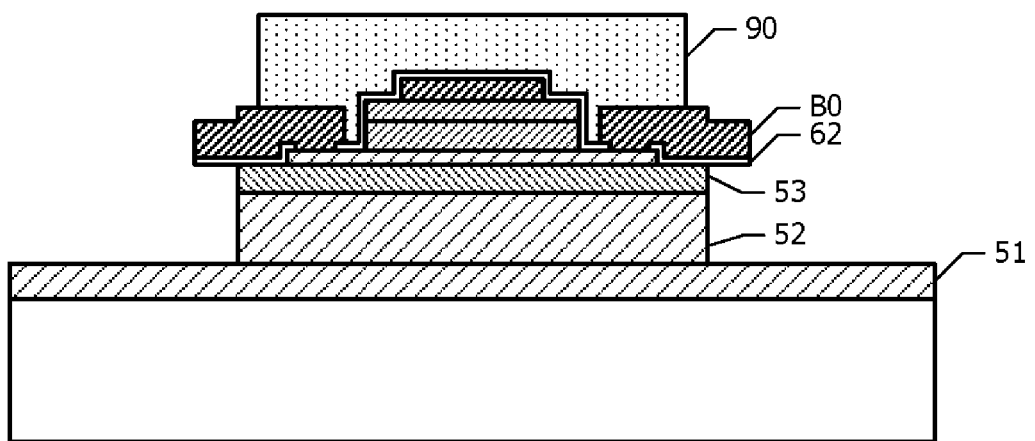

As illustrated in FIG. 6C, the base layer 53 and the collector layer 52 are etched with the phosphoric acid hydrogen peroxide mixed liquid by using the photoresist film 90, the base electrode B0, and the insulating film 62 as an etching mask until the sub-collector layer 51 is exposed. The amount of etching is controlled by the etching time. The base layer 53 and the collector layer 52 are side-etched. Thereby, the side face of the base layer 53 and the collector layer 52 (the edge of the junction interface between the two layers) recedes from the outer edge of the base electrode B0 toward the inside.

Figure 7A:
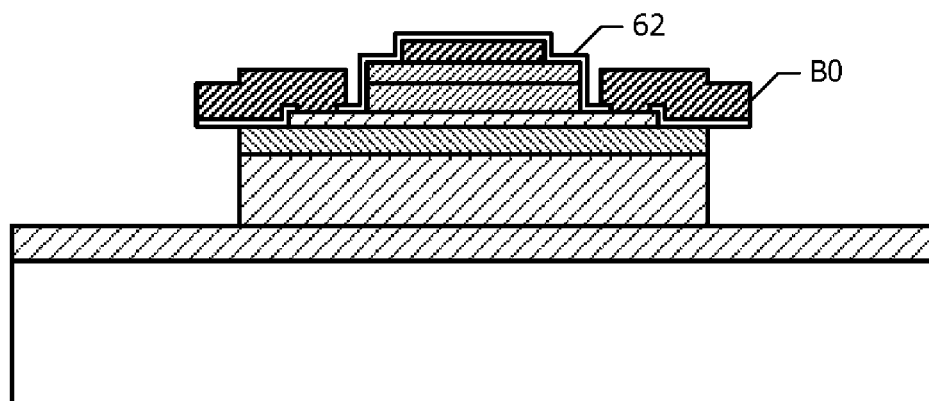
FIGS. 7A, 7B, and 7C are sectional views of an HBT according to the first embodiment during its production.

As illustrated in FIG. 7A, the photoresist film 90 (FIG. 6C) used as the etching mask is removed. The entire region of the upper surface of the base electrode B0 and the insulating film 62 are thereby exposed.

Figure 7B:
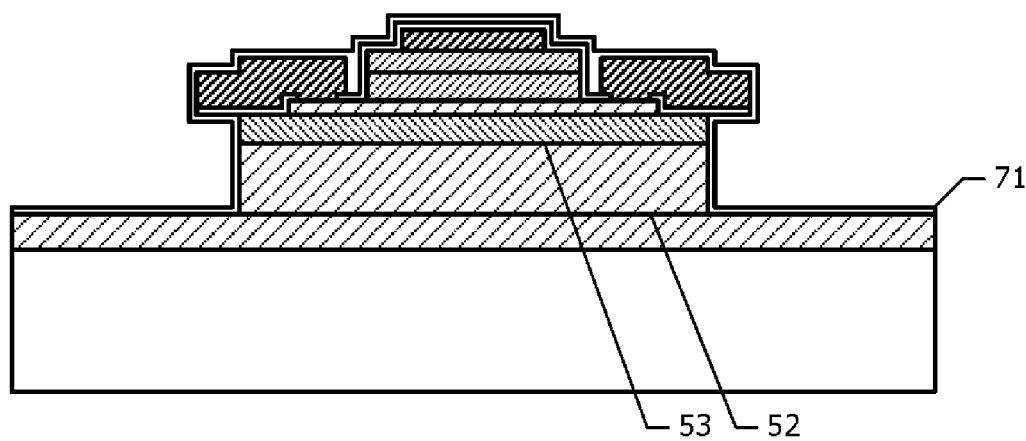

As illustrated in FIG. 7B, an interlayer insulating film 71 is deposited over the entire region of the exposed surface by CVD. The interlayer insulating film 71 has a function of protecting the exposed edge of the p-n junction interface between the collector layer 52 and the base layer 53.

Figure 7C:
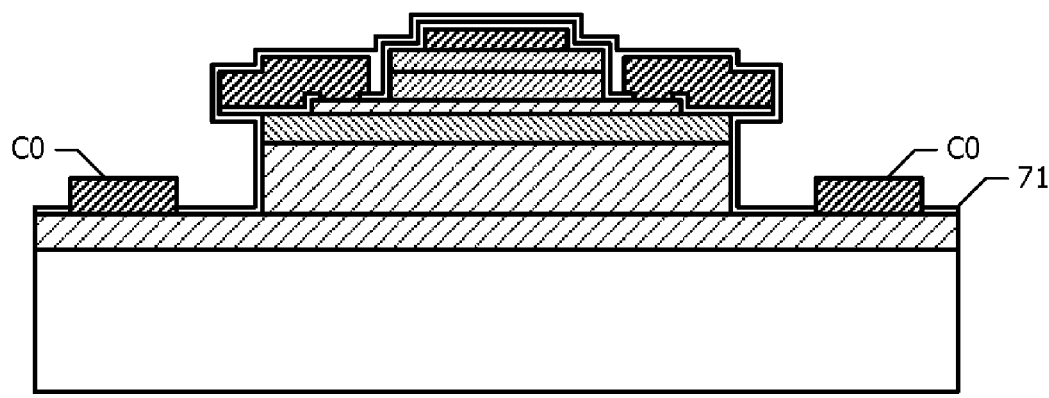

As illustrated in FIG. 7C, openings are formed by etching predetermined regions of the interlayer insulating film 71, and collector electrodes C0 are formed on the sub-collector layer 51 in the openings. In the formation of the openings in the interlayer insulating film 71, a photoresist film for lift-off is used as an etching mask. The collector electrodes C0 are formed by vacuum evaporation and a lift-off method.

Figure 8A:
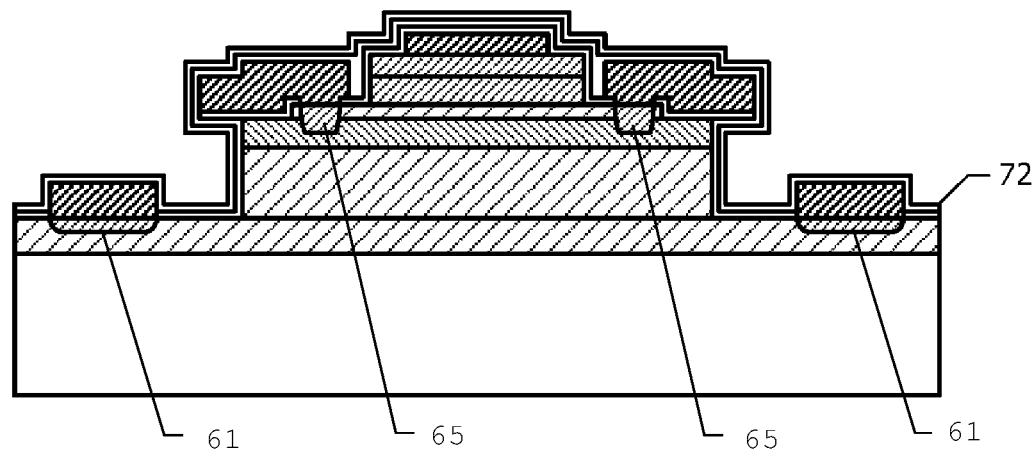
FIGS. 8A, 8B, and 8C are sectional views of an HBT according to the first embodiment during its production.

As illustrated in FIG. 8A, an interlayer insulating film 72 is deposited over the entire region of the exposed surface by CVD. Subsequently, heat treatment is conducted in a nitrogen atmosphere at 350° C. for 30 minutes to form a base electrode alloy layer 65 and a collector electrode alloy layer 61.

Figure 8B:
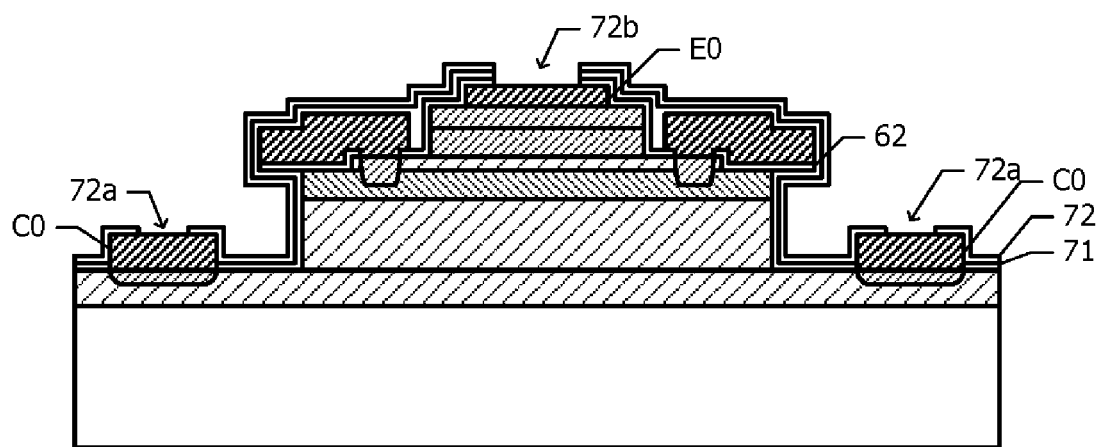

As illustrated in FIG. 8B, openings 72a for exposing the upper surfaces of the collector electrodes C0 are formed in the interlayer insulating film 72. At the same time, an opening 72b for exposing the upper surface of the emitter electrode E0 is formed in the three layers of the insulating film 62 and the interlayer insulating films 71 and 72.

Figure 8C:
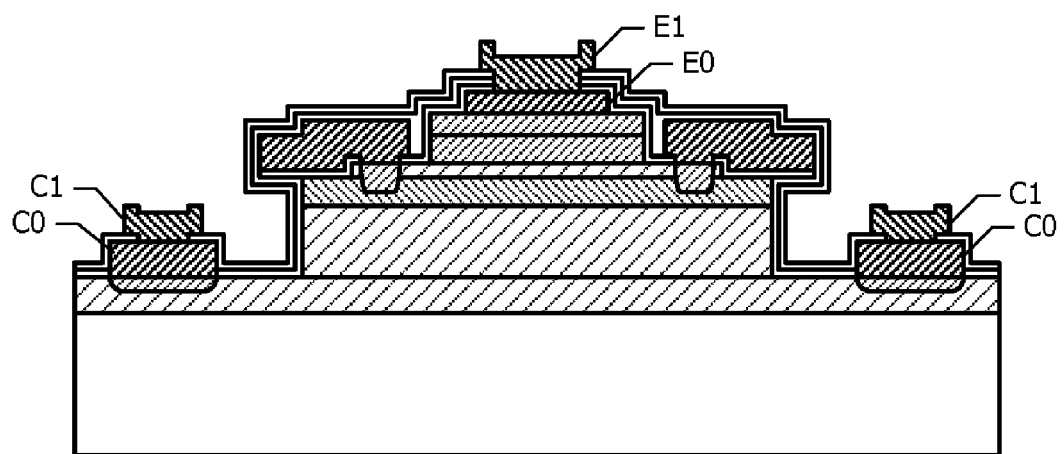

As illustrated in FIG. 8C, first-layer collector wiring lines C1 are formed on the collector electrodes C0, and a first-layer emitter wiring line E1 is formed on the emitter electrode E0. The first-layer collector wiring lines C1 and the emitter wiring line E1 can be formed by vacuum evaporation and a lift-off method.

Figure 9A:
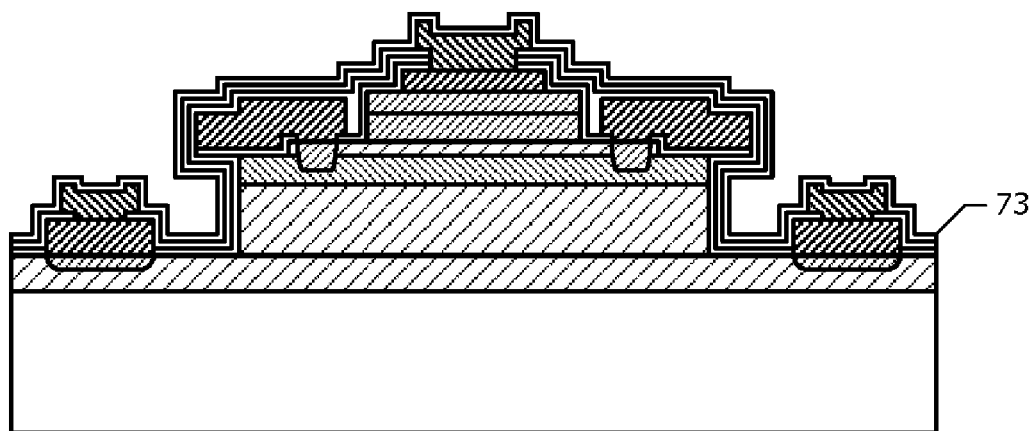
FIGS. 9A, 9B, and 9C are sectional views of an HBT according to the first embodiment during its production.
Figure 9B:
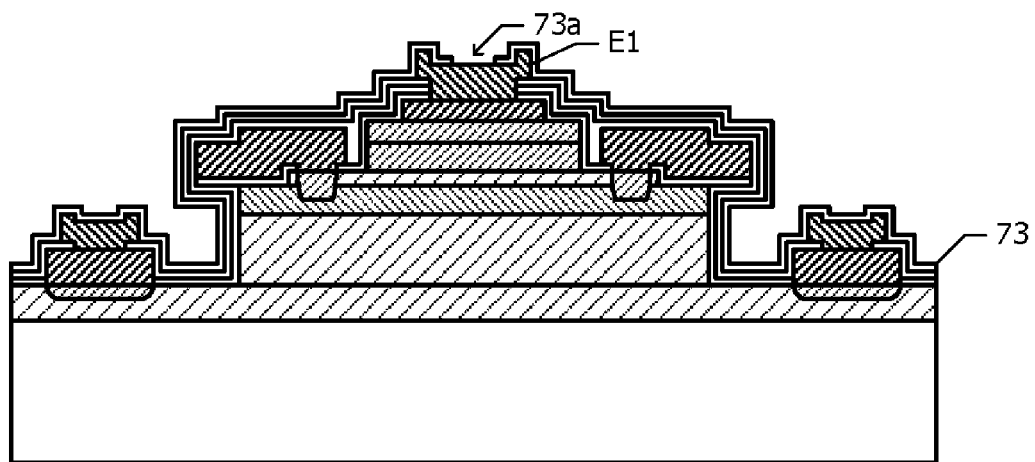

As illustrated in FIG. 9A, an interlayer insulating film 73 is deposited over the entire region of the exposed surface by CVD. As illustrated in FIG. 9B, an opening 73a for exposing the upper surface of the first-layer emitter wiring line E1 is formed in the interlayer insulating film 73.

Figure 9C:
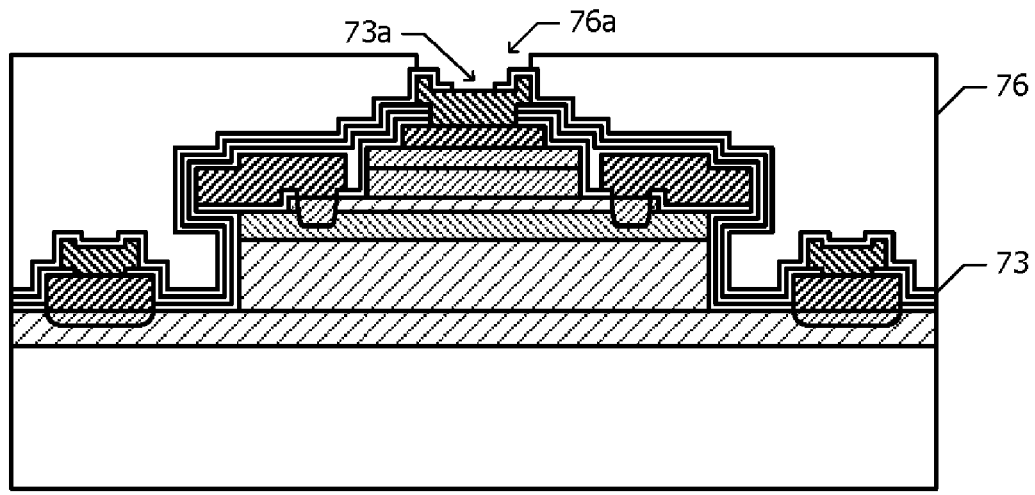

As illustrated in FIG. 9C, a planarizing insulating film 76 is formed by applying a polyimide to the entire region of the exposed surface. Subsequently, an opening 76a is formed in the planarizing insulating film 76. In plan view, the opening 76a includes therein the opening 73a formed in the interlayer insulating film 73.

Subsequently, a second-layer emitter wiring line E2 (FIG. 1B) and a second-layer collector wiring line C2 (FIG. 1A) are formed on the planarizing insulating film 76 by vacuum evaporation and a lift-off method. Bumps such as Cu pillar bumps or solder bumps may be formed on the second-layer emitter wiring line E2 and the collector wiring line C2.

Modification of First Embodiment

In the HBT according to the first embodiment, GaAs is used as the base layer 53. Alternatively, other compound semiconductors may be used. For example, AlGaAs, InGaAs, GaAsSb, GaAsPBi, GaInNAs, GaAsBi, GaAsN, or GaAsBiN may be used as the base layer 53. Alternatively, the base layer 53 may have a multilayer base structure including a plurality of layers made of these compound semiconductors. Alternatively, a composition gradient base structure or a doping concentration gradient base structure may be adopted.

In the HBT according to the first embodiment, GaAs is used as the collector layer 52. Alternatively, other compound semiconductors may be used. For example, AlGaAs, InGaAs, or InP may be used as the collector layer 52. Alternatively, the collector layer 52 may have a multilayer collector structure including a plurality of layers made of these compound semiconductors. Alternatively, a composition gradient collector structure or a doping concentration gradient collector structure may be adopted.

In the HBT according to the first embodiment, GaAs is used as substrate 50. Alternatively, other compound semiconductors may be used. For example, an InP substrate may be used.

In the first embodiment, an n-p-n-type HBT has been described as an example. The distinctive structure of the HBT according to the first embodiment is applicable to a p-n-p-type HBT. Although a bipolar transistor having a heterojunction has been described as an example in the first embodiment, the distinctive structure of the first embodiment is also applicable to common bipolar transistors.

Second Embodiment

Next, an HBT according to a second embodiment will be described with reference to FIGS. 10A to 11B. Hereinafter, descriptions of configurations that are common to those of the HBT according to the first embodiment will be omitted.

Figure 10A:
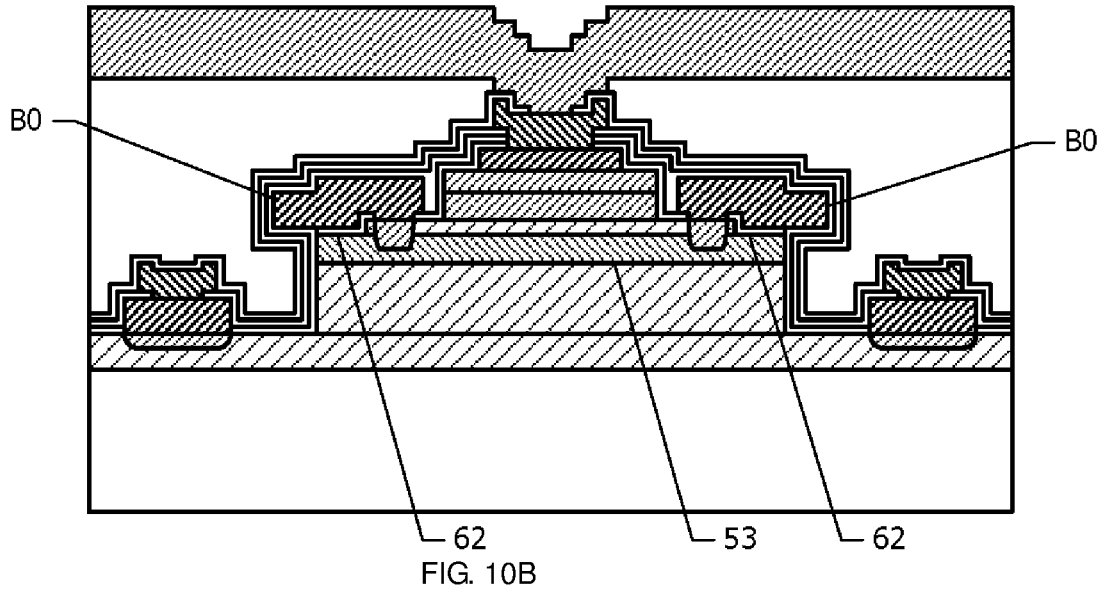
FIGS. 10A and 10B are sectional views of an HBT according to a second embodiment.
Figure 10B:
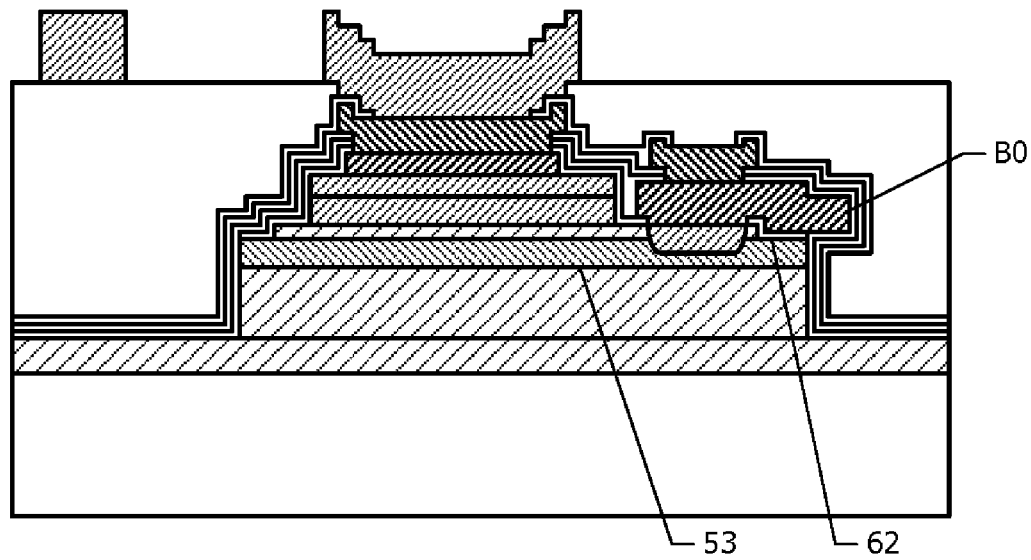
Figure 10C:
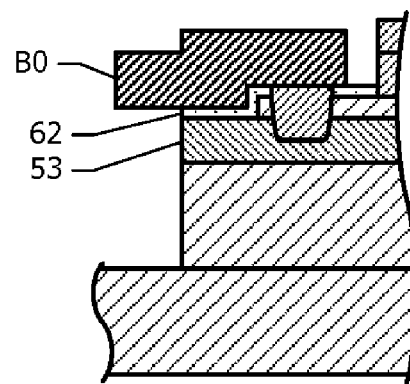
FIG. 10C is a sectional view of a base electrode and its vicinity of an HBT according to the second embodiment.

FIGS. 10A and 10B are sectional views of an HBT according to the second embodiment and correspond to the section of the HBT in FIG. 1B and the section of the HBT in FIG. 2A, respectively, according to the first embodiment. FIG. 10C is a sectional view of a base electrode B0 and its vicinity of an HBT according to the second embodiment. In the first embodiment, the lower surface of a portion of the base electrode B0, the portion projecting outward from the edge of the base layer 53, is covered with the insulating film 62 (FIGS. 1B and 2A).

In the second embodiment, the lower surface of a portion of a base electrode B0, the portion projecting outward from the edge of a base layer 53, is not covered with an insulating film 62. The edge of the insulating film 62 substantially coincides with the edge of the base layer 53 in plan view.

Furthermore, in the first embodiment, the insulating film 62 projects outward from the edge on the left side of the base layer 53 illustrated in FIG. 2A. In the second embodiment, the edge of the insulating film 62 in this portion also substantially coincides with the edge of the base layer 53.

Next, a method for producing an HBT according to the second embodiment will be described with reference to FIGS. 11A and 11B.

Figure 11A:
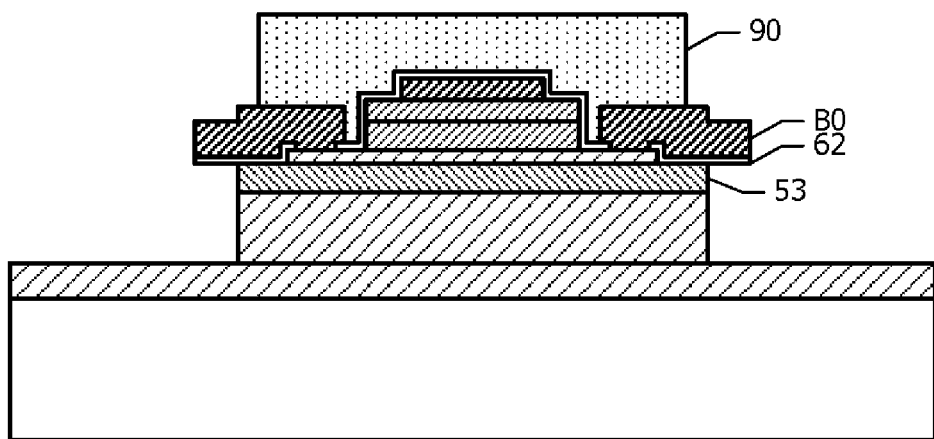
FIGS. 11A and 11B are sectional views of an HBT according to the second embodiment during its production.

FIG. 11A is the same sectional view as the sectional view of FIG. 6C, which illustrates an HBT according to the first embodiment during its production. In this stage, the lower surface of a portion of a base electrode B0, the portion projecting outward from the edge of a base layer 53, is covered with an insulating film 62.

Figure 11B:
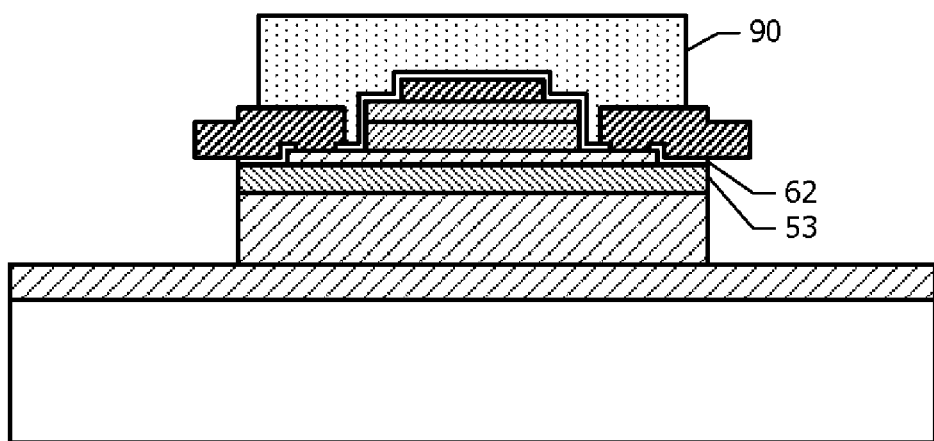

As illustrated in FIG. 11B, the insulating film 62 located outside the edge of the base layer 53 is removed by etching using, for example, buffered hydrofluoric acid. The subsequent steps are common to the steps of producing the HBT according to the first embodiment. The insulating film 62 located inside the inner edge of the base electrode B0 is not etched because the insulating film 62 is covered with a photoresist film 90.

Next, advantageous effects of the HBT according to the second embodiment will be described. In the second embodiment, an advantageous effect is obtained in that high-speed operation is realized as in the first embodiment. When the insulating film 62 is left on the lower surface of the projecting portion of the base electrode B0 as in the first embodiment, the possibility of occurrence of process defects, such as separation, may increase in the subsequent steps. In the second embodiment, since the insulating film 62 in this portion is removed, the occurrence of process defects can be suppressed.

Third Embodiment

Next, an HBT according to a third embodiment will be described with reference to FIGS. 12 to 13C. Hereinafter, descriptions of configurations that are common to those of the HBT according to the first embodiment will be omitted.

Figure 12:
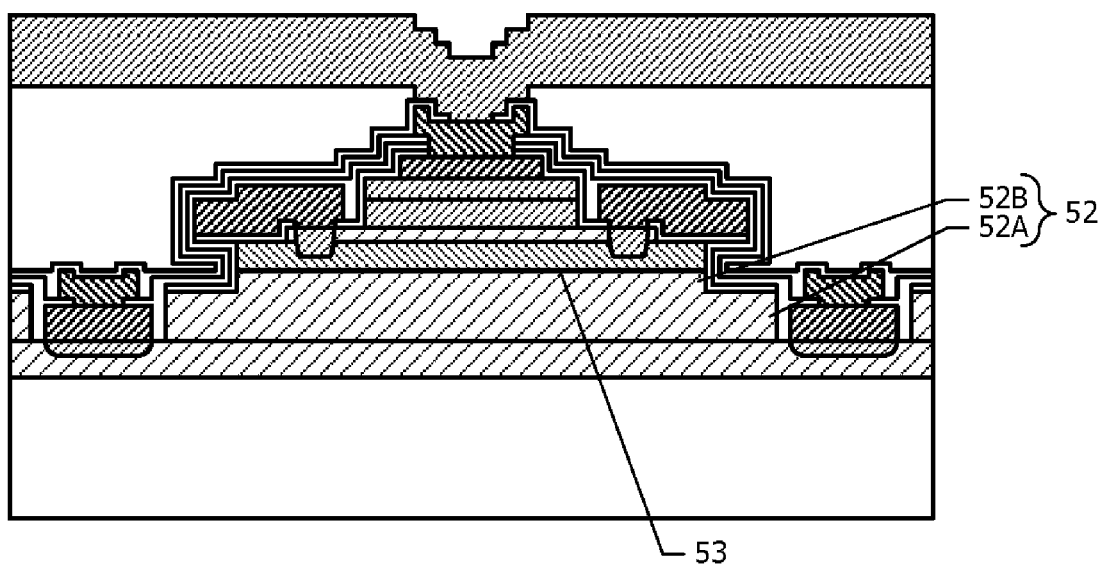
FIG. 12 is a sectional view of an HBT according to a third embodiment.

FIG. 12 is a sectional view of an HBT according to the third embodiment and corresponds to the sectional view of the HBT illustrated in FIG. 1B according to the first embodiment. In the first embodiment, the side face of the collector layer 52 (FIG. 1B) coincides with the edge of the base layer 53 in the range from the lower surface to the upper surface of the collector layer 52. In the third embodiment, as illustrated in FIG. 12, the edge of an upper collector layer 52B which is an upper portion of a collector layer 52 coincides with the edge of the base layer 53 in plan view, and the edge of a lower collector layer 52A which is a remaining lower portion is located outside the edge of the base layer 53.

Alternatively, the side face of the upper collector layer 52B is continuous with the side face of the base layer 53 smoothly (without forming a step).

Next, a method for producing an HBT according to the third embodiment will be described with reference to FIGS. 13A to 13C.

Figure 13A:
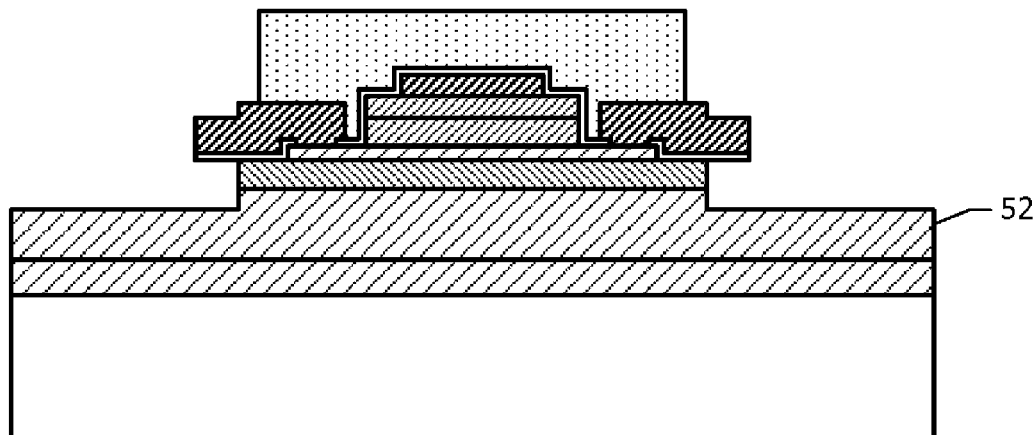
FIGS. 13A, 13B, and 13C are sectional views of an HBT according to the third embodiment during its production.

FIG. 13A is a sectional view corresponding to the sectional view of the HBT during its production illustrated in FIG. 6C according to the first embodiment. In the first embodiment, the etching is performed to the upper surface of the sub-collector layer 51 (FIG. 6C). In the third embodiment, the etching is performed to an intermediate point of a collector layer 52 in the thickness direction.

Figure 13B:
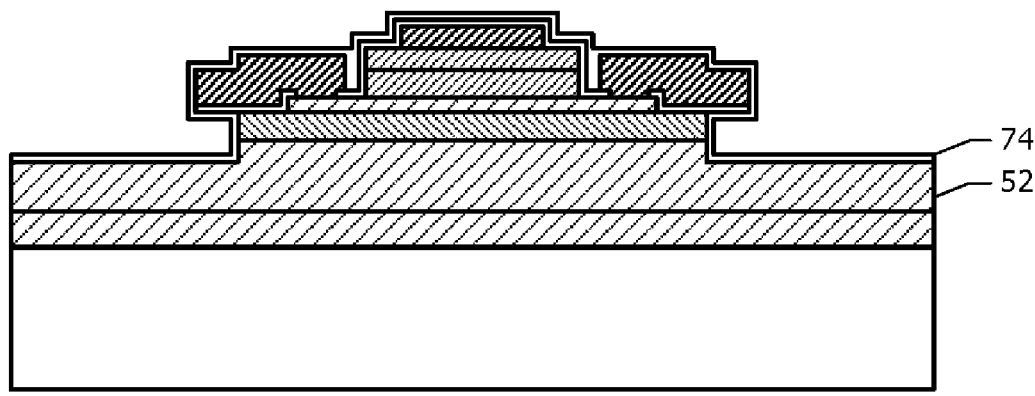

As illustrated in FIG. 13B, after the etching is performed to the intermediate point of the collector layer 52, an interlayer insulating film 74 is deposited over the entire region of the exposed surface by, for example, CVD. The interlayer insulating film 74 is made of, for example, SiN and has a thickness of, for example, 50 nm.

Figure 13C:
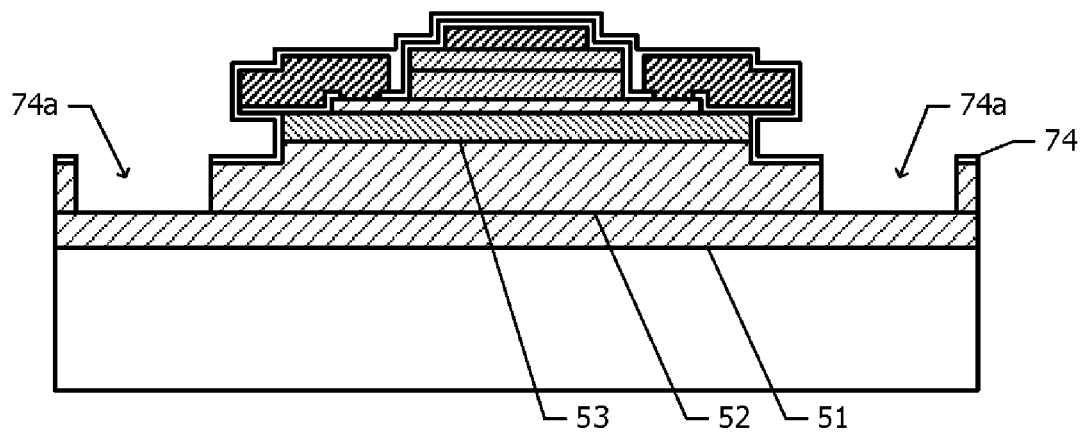

As illustrated in FIG. 13C, openings 74a that extend through the interlayer insulating film 74 and the collector layer 52 are formed in regions where collector electrodes C0 (FIG. 1B) are to be formed. A sub-collector layer 51 is exposed in the openings 74a. The subsequent steps are common to the step illustrated in FIG. 7C and the subsequent steps of the first embodiment. In the third embodiment, the interlayer insulating film 71 (FIG. 7C) of the first embodiment is unnecessary because the edge of the p-n junction interface between the collector layer 52 and a base layer 53 is protected by the interlayer insulating film 74.

Next, advantageous effects of the HBT according to the third embodiment will be described. In the third embodiment, an advantageous effect is obtained in that high-speed operation is realized as in the first embodiment. In the first embodiment, in the step illustrated in FIG. 6C, the etching depth in the lateral direction is determined by the etching time of the base layer 53 and the collector layer 52 in the thickness direction. In contrast, in the third embodiment, the base layer 53 and an upper portion of the collector layer 52 are etched to a desired depth in the lateral direction (FIG. 13A), and subsequently, the remaining portion of the collector layer 52 can be etched in the thickness direction (FIG. 13C). Therefore, the degree of freedom in the etching depth of base layer 53 and the upper portion of the collector layer 52 in the lateral direction is enhanced. Furthermore, the depth of the etching of the base layer 53 and the upper portion of the collector layer 52 in the lateral direction is smaller than that in the case of the first embodiment. Therefore, process controllability can be enhanced.

Modification of Third Embodiment

In the third embodiment, the insulating film 62 that covers the lower surface of the projecting portion of the base electrode B0 may be removed as in the configuration of the second embodiment (FIGS. 10A, 10B, and 10C). In the third embodiment, the collector layer 52 has a uniform doping concentration. The doping concentration of the upper collector layer 52B (FIG. 12) is preferably lower than the doping concentration of the lower collector layer 52A (FIG. 12). Such a doping concentration distribution enables a radio-frequency linearity to be enhanced. Note that the position at which the doping concentration of the collector layer 52 changes need not coincides with the boundary between the upper collector layer 52B and the lower collector layer 52A.

The thickness of the upper collector layer 52B (FIG. 12) is preferably smaller than the thickness of the lower collector layer 52A. This configuration provides an advantageous effect of an improvement in etching controllability in the lateral direction. As a result, the positional relationship between the outer edge of the base electrode B0 and the edge of the base layer 53 can be controlled with high accuracy.

Fourth Embodiment

Next, an HBT according to a fourth embodiment will be described with reference to FIGS. 14A and 14B. Hereinafter, descriptions of configurations that are common to those of the HBT according to the first embodiment will be omitted.

Figure 14A:
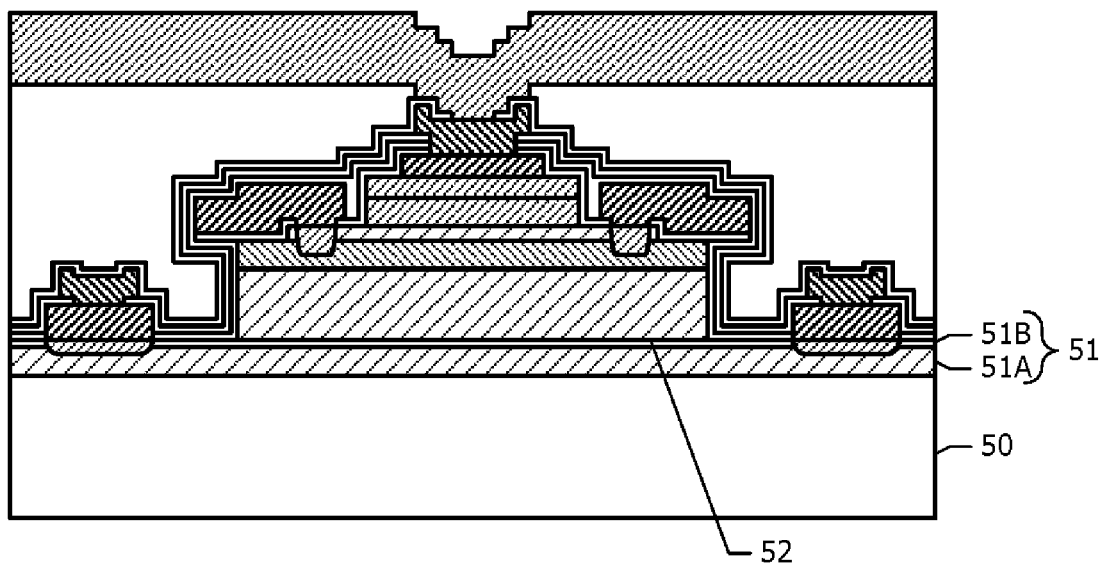
FIG. 14A is a sectional view of an HBT according to a fourth embodiment.

FIG. 14A is a sectional view of an HBT according to the fourth embodiment and corresponds to the sectional view of the HBT in FIG. 1B according to the first embodiment. In the first embodiment, the sub-collector layer 51 is formed by a single compound semiconductor layer. In the fourth embodiment, a sub-collector layer 51 includes a first sub-collector layer 51A disposed on a substrate 50 and a second sub-collector layer 51B disposed on the first sub-collector layer 51A.

The second sub-collector layer 51B has etching characteristics different from etching characteristics of a portion of the collector layer 52, the portion being in contact with the second sub-collector layer 51B. For example, the first sub-collector layer 51A is made of n-type GaAs having a Si doping concentration of $5 \times 10^{18}$ cm$^{-3}$ and has a film thickness of 600 nm. The second sub-collector layer 51B is made of n-type InGaP having a molar ratio of InP of 0.48 and a Si doping concentration of $5 \times 10^{18}$ cm$^{-3}$ and has a film thickness of 20 nm. The collector layer 52 is made of n-type GaAs as in the first embodiment.

Figure 14B:
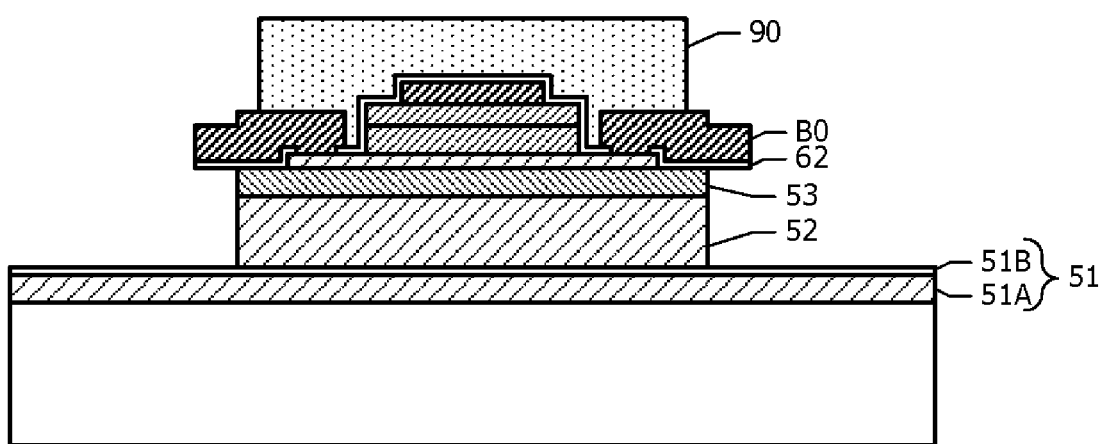
FIG. 14B is a sectional view of an HBT according to the fourth embodiment during its production.

FIG. 14B is a sectional view of an HBT during its production and corresponds to the sectional view of the HBT during its production illustrated in FIG. 6C according to the first embodiment. A base layer 53 and a collector layer 52 are etched by using a photoresist film 90, a base electrode B0, and an insulating film 62 as an etching mask. The etching conditions are the same as those in the first embodiment. Under the etching conditions, a second sub-collector layer 51B made of n-type InGaP is not substantially etched, and the base layer 53 and the collector layer 52 can be selectively etched. The subsequent steps are common to the steps of producing the HBT according to the first embodiment.

Next, advantageous effects of the HBT according to the fourth embodiment will be described. In the fourth embodiment, an advantageous effect is obtained in that high-speed operation is realized as in the first embodiment. Furthermore, in the fourth embodiment, since the second sub-collector layer 51B functions as an etching stopper in the etching step illustrated in FIG. 14B, side etching of the base layer 53 and the collector layer 52 can be continued even after the sub-collector layer 51 is exposed. Therefore, the amount of etching of the base layer 53 and the collector layer 52 in the lateral direction can be controlled independently from the amount of etching in the thickness direction.

Modification of Fourth Embodiment

In the fourth embodiment, the insulating film 62 that covers the lower surface of the projecting portion of the base electrode B0 may be removed as in the configuration of the second embodiment (FIGS. 10A, 10B, and 10C).

Fifth Embodiment

Next, an HBT according to a fifth embodiment will be described with reference to FIGS. 15 to 16C. Hereinafter, descriptions of configurations that are common to those of the HBT according to the third embodiment (FIG. 12) will be omitted.

Figure 15:
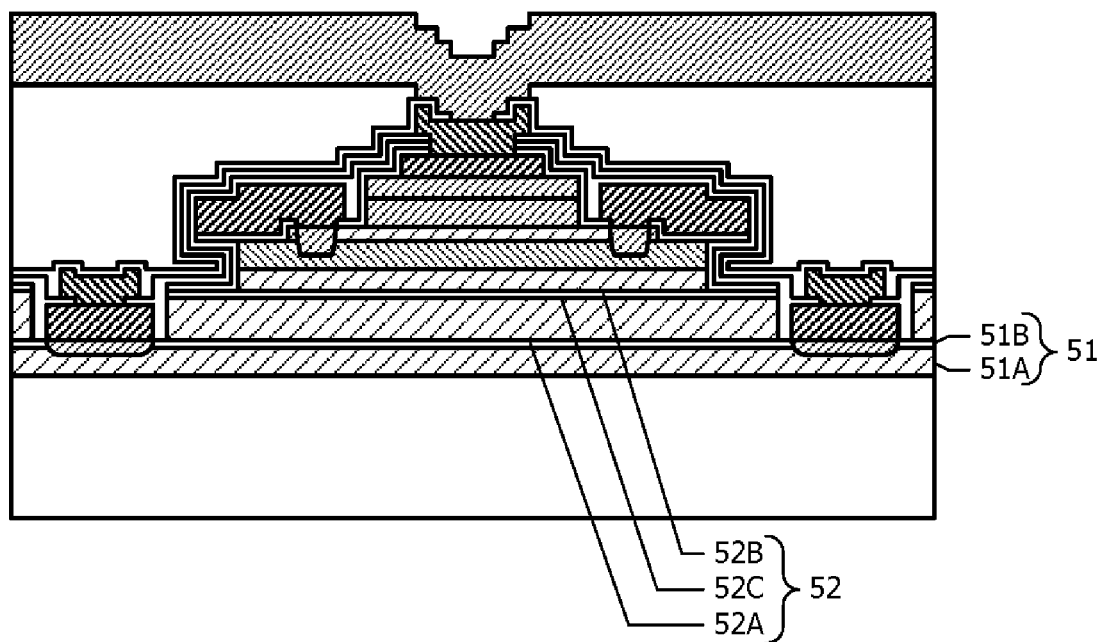
FIG. 15 is a sectional view of an HBT according to a fifth embodiment.

FIG. 15 is a sectional view of an HBT according to the fifth embodiment and corresponds to the sectional view illustrated in FIG. 12 according to the third embodiment. In the third embodiment, the collector layer 52 is divided into the upper collector layer 52B and the lower collector layer 52A, but the boundary between the upper collector layer 52B and the lower collector layer 52A is not clear. In the fifth embodiment, a collector layer 52 includes an intermediate collector layer 52C disposed at an intermediate position in the thickness direction thereof and made of a semiconductor material having etching characteristics different from those of a semiconductor material of another portion. The collector layer 52 is divided by the intermediate collector layer 52C into an upper collector layer 52B and a lower collector layer 52A.

For example, the lower collector layer 52A and the upper collector layer 52B are each made of n-type GaAs having a Si doping concentration of $1 \times 10^{16}$ cm$^{-3}$. The thickness of the lower collector layer 52A and the thickness of the upper collector layer 52B are, for example, 700 nm and 300 nm, respectively. The intermediate collector layer 52C is made of, for example, undoped InGaP having a molar ratio of InP of 0.48. The thickness of the intermediate collector layer 52C is, for example, 10 nm. The thickness of the intermediate collector layer 52C is set to be small to such an extent that the transfer of carriers is not blocked. A sub-collector layer 51 includes a first sub-collector layer 51A and a second sub-collector layer 51B as in the configuration of the fourth embodiment (FIG. 14A).

Figure 16A:
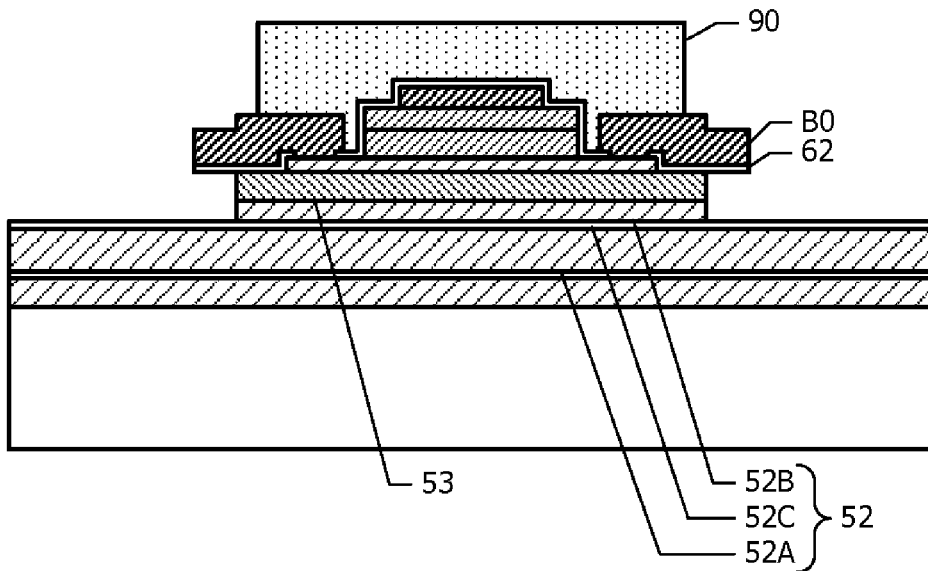
FIGS. 16A, 16B, and 16C are sectional views of an HBT according to the fifth embodiment during its production.
Figure 16B:
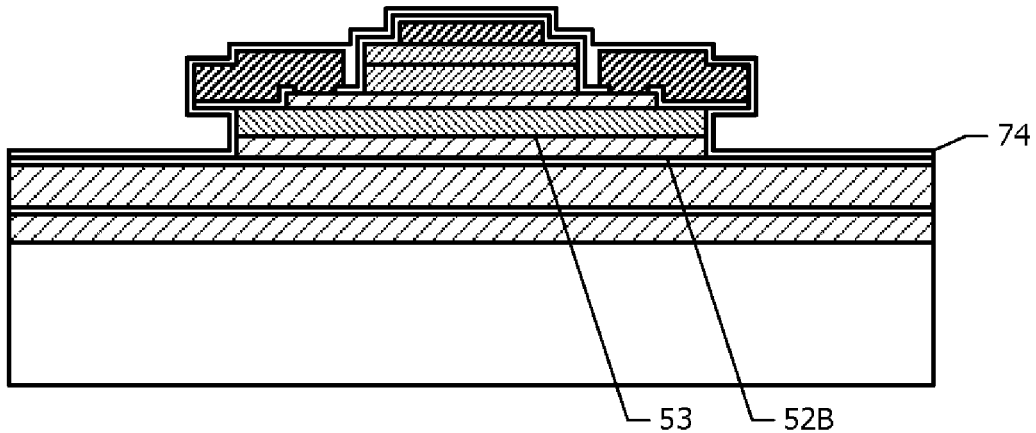

Next, a method for producing an HBT according to the fifth embodiment will be described with reference to FIGS. 16A, 16B, and 16C. FIGS. 16A, 16B, and 16C correspond to the sectional views of the HBT during its production illustrated in FIGS. 13A, 13B, and 13C, respectively, according to the third embodiment.

As illustrated in FIG. 16A, a base layer 53 and an upper collector layer 52B are etched by using a photoresist film 90, a base electrode B0, and an insulating film 62 as an etching mask. The etching conditions are the same as the conditions in the etching step illustrated in FIG. 13A. An intermediate collector layer 52C made of InGaP is not substantially etched under the etching conditions. Therefore, the base layer 53 and the upper collector layer 52B can be selectively etched relative to the intermediate collector layer 52C.

This provides a structure in which the edge of the base layer 53 coincides with the edge of the upper collector layer 52B in plan view. Furthermore, the side face of the base layer 53 is continuous with the side face of the upper collector layer 52B smoothly without forming a step.

As illustrated in FIG. 16B, an interlayer insulating film 74 is deposited so as to cover the entire region of the exposed surface. The interlayer insulating film 74 protects an exposed end portion of the p-n junction interface between the base layer 53 and the upper collector layer 52B.

Figure 16C:
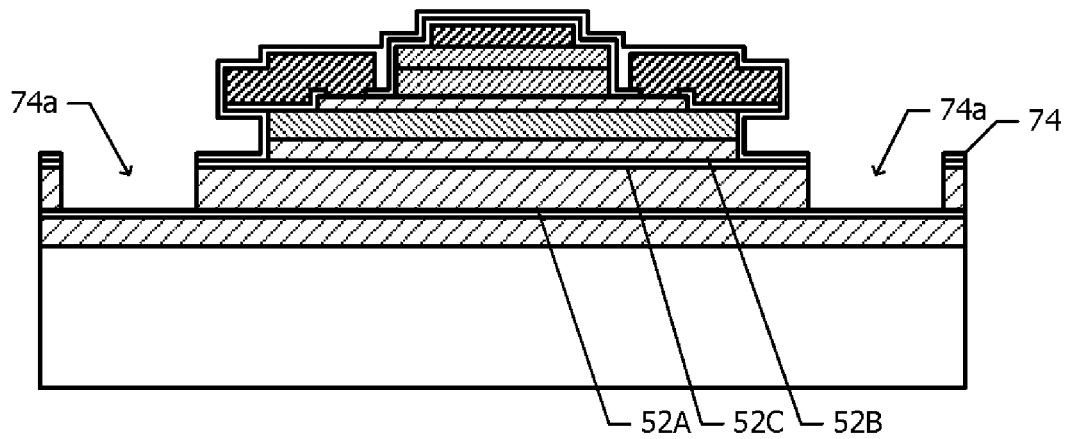

As illustrated in FIG. 16C, openings 74a that extend through the interlayer insulating film 74, the intermediate collector layer 52C, and a lower collector layer 52A are formed. The interlayer insulating film 74 can be etched by using buffered hydrofluoric acid, the intermediate collector layer 52C can be etched by using hydrochloric acid, and the lower collector layer 52A can be etched by using the phosphoric acid hydrogen peroxide mixed liquid. The upper collector layer 52B is disposed inside the intermediate collector layer 52C and the lower collector layer 52A in plan view. The subsequent steps are common to the steps of producing the HBT according to the third embodiment.

Next, advantageous effects of the HBT according to the fifth embodiment will be described. In the fifth embodiment, an advantageous effect is obtained in that high-speed operation is realized as in the first embodiment. Furthermore, in the fifth embodiment, the intermediate collector layer 52C functions as an etching stopper in the etching step illustrated in FIG. 16A. Therefore, the etching time of the base layer 53 and the upper collector layer 52B in the lateral direction can be set independently from the etching in the depth direction compared with the etching step illustrated in FIG. 13A according to the third embodiment. Therefore, the degree of freedom in the etching depth in the lateral direction is enhanced.

To enhance etching controllability in the lateral direction, the thickness of the upper collector layer 52B is preferably smaller than the thickness of the lower collector layer 52A. The thickness of the intermediate collector layer 52C is preferably determined so that a quantum-mechanical tunneling effect is exhibited and is, for example, 20 nm or less. When the thickness of the intermediate collector layer 52C is determined in this manner, it is possible to suppress blocking of electron transit in the collector layer 52 by the intermediate collector layer 52C.

Modification of Fifth Embodiment

In the fifth embodiment, the insulating film 62 that covers the lower surface of the projecting portion of the base electrode B0 may be removed as in the configuration of the second embodiment (FIGS. 10A, 10B, and 10C).

Sixth Embodiment

Next, an HBT according to a sixth embodiment will be described with reference to FIGS. 17A to 21C. Hereinafter, descriptions of configurations that are common to those of the HBT according to the first embodiment (FIGS. 1A to 9C) will be omitted.

Figure 17A:
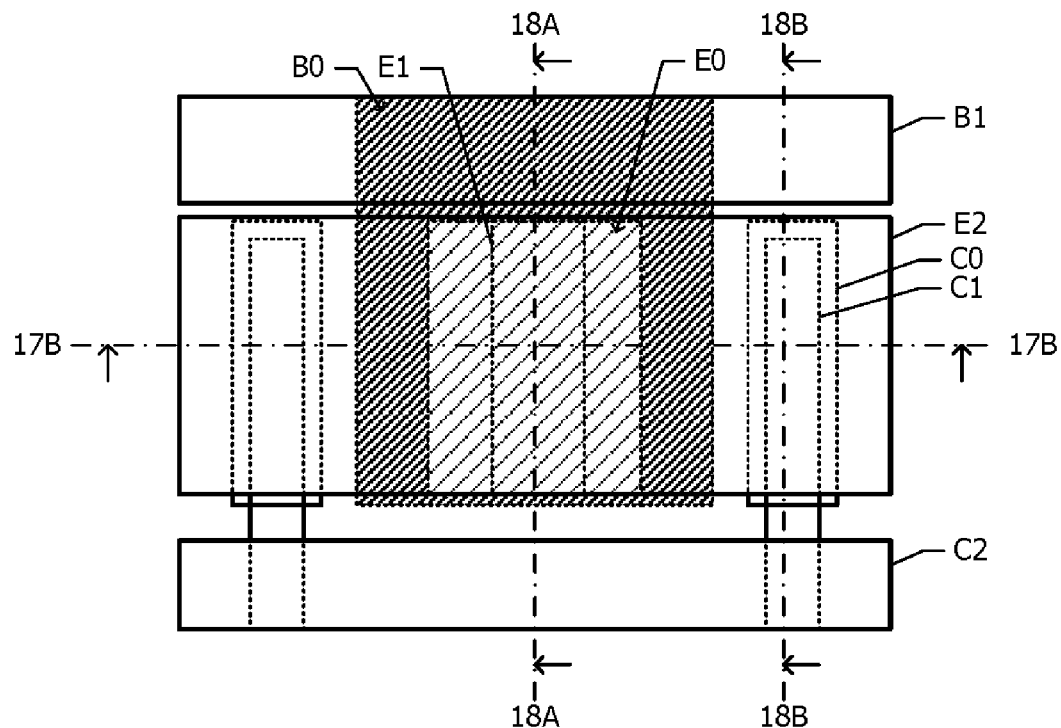
FIG. 17A is a plan view of electrodes connected to a collector, a base, and an emitter of an HBT and wiring lines disposed thereon, according to a sixth embodiment.

FIG. 17A is a plan view of electrodes connected to a collector, a base, and an emitter of an HBT and wiring lines disposed thereon, according to the sixth embodiment. In FIG. 17A, a base electrode B0 is densely hatched, and an emitter electrode E0 is lightly hatched.

In the first embodiment, as illustrated in FIG. 1A, the emitter electrode E0 is surrounded by the horseshoe-shaped base electrode B0 from the three directions and disposed apart from the inner edge of the base electrode B0 in plan view. In the sixth embodiment, as illustrated in FIG. 17A, the emitter electrode E0 is surrounded by the base electrode B0 from four directions, and the edge of the emitter electrode E0 coincides with the inner edge of the base electrode B0.

Figure 17B:
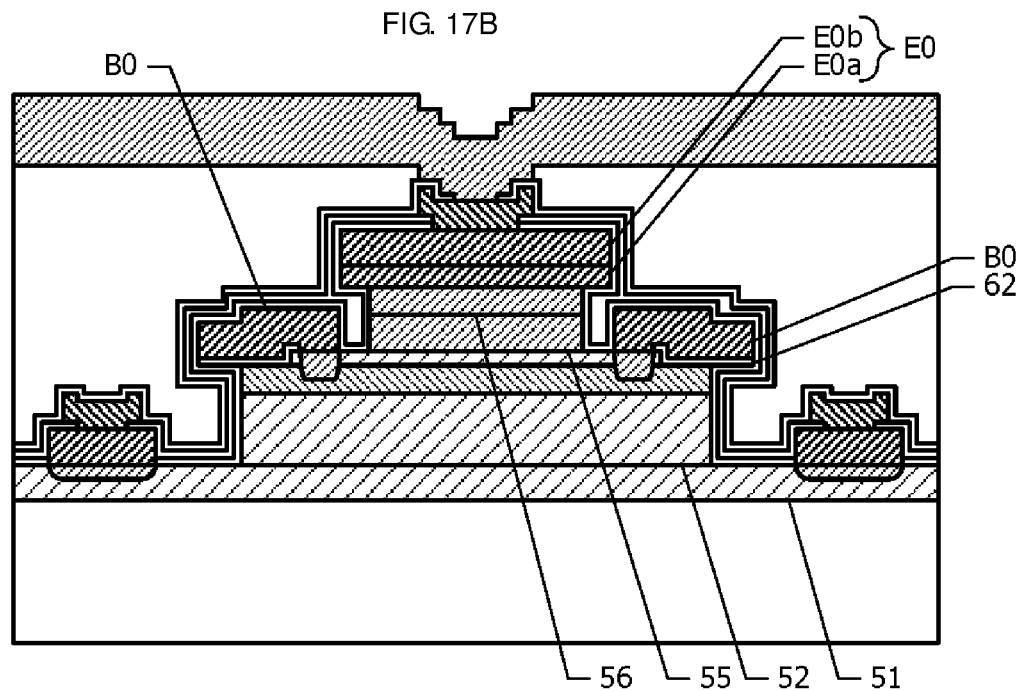
FIG. 17B is a sectional view taken along dash-dotted line 17B-17B in FIG. 17A.

FIG. 17B is a sectional view taken along dash-dotted line 17B-17B in FIG. 17A. The emitter electrode E0 has a two-layer structure including a lower layer E0a and an upper layer E0b disposed on the lower layer E0a. The lower layer E0a of the emitter electrode E0 is made of, for example, WSi having a molar ratio of Si of 0.3 and has a thickness of, for example, 300 nm. The upper layer E0b of the emitter electrode E0 has the same layered structure as the base electrode B0.

In plan view, the edge of the emitter electrode E0 is located outside the edges of a first contact layer 55 and a second contact layer 56 disposed under the emitter electrode E0. Specifically, the emitter electrode E0 projects outward from the edges of the first contact layer 55 and the second contact layer 56 and has an eaves-shaped structure. The inner edge of the base electrode B0 is located right under the edge of the emitter electrode E0.

In the first embodiment, as illustrated in FIGS. 1B and 7A, the insulating film 62 is disposed in a region inside the inner edge of the base electrode B0. In the sixth embodiment, an insulating film 62 is disposed on the lower surface of the base electrode B0, but the insulating film 62 is not provided in a region inside the inner edge of the base electrode B0.

Figure 18A:
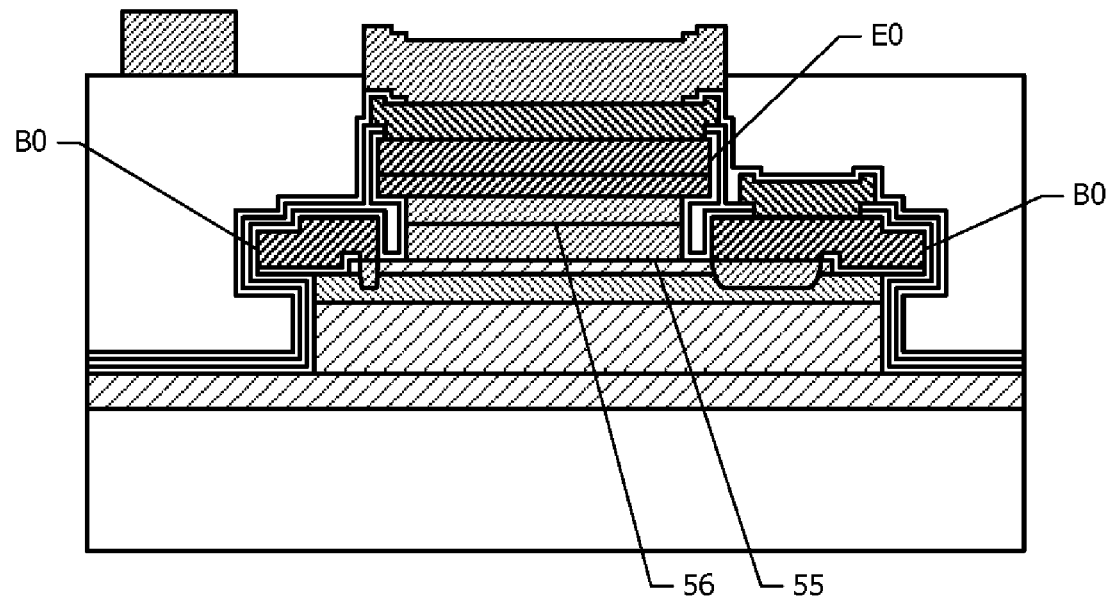
FIGS. 18A and 18B are sectional views of an HBT taken along dash-dotted lines 18A-18A and 18B-18B, respectively, in FIG. 17A.

FIG. 18A is a sectional view taken along dash-dotted line 18A-18A in FIG. 17A. In this section, the emitter electrode E0 projects outward from the edges of the first contact layer 55 and the second contact layer 56 and has an eaves-shaped structure as in the section illustrated in FIG. 17B. Furthermore, the inner edge of the base electrode B0 is located right under the edge of the emitter electrode E0.

Figure 18B:
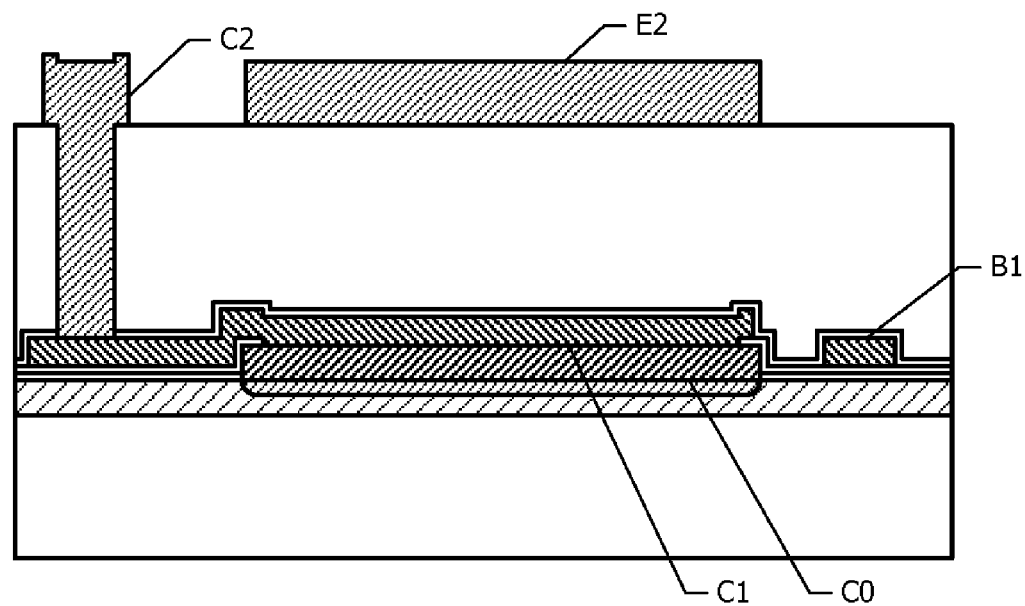

FIG. 18B is a sectional view taken along dash-dotted line 18B-18B in FIG. 17A. The sectional structure illustrated in FIG. 18B is the same as the sectional structure of the first embodiment illustrated in FIG. 2B.

Next, a method for producing an HBT according to the sixth embodiment will be described with reference to FIGS. 19A to 21C. FIGS. 19A to 21C are sectional views of an HBT during its production.

Figure 19A:
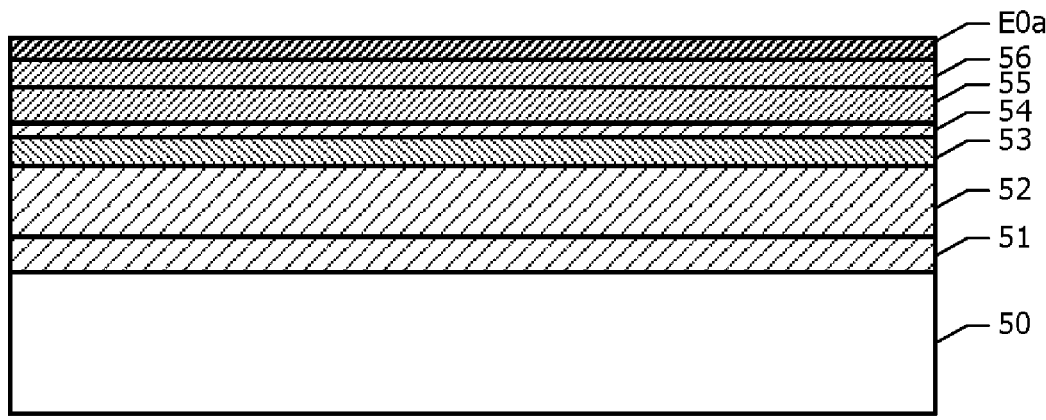
FIGS. 19A, 19B, and 19C are sectional views of an HBT according to the sixth embodiment during its production.

As illustrated in FIG. 19A, semiconductor layers including a sub-collector layer 51 to a second contact layer 56 are grown on a substrate 50. This step is common to the step of forming the layers including the sub-collector layer 51 to the second contact layer 56 according to the first embodiment, the step being illustrated in FIG. 4A. A lower layer E0a of an emitter electrode E0 is deposited on the second contact layer 56 by, for example, radio-frequency sputtering.

Figure 19B:
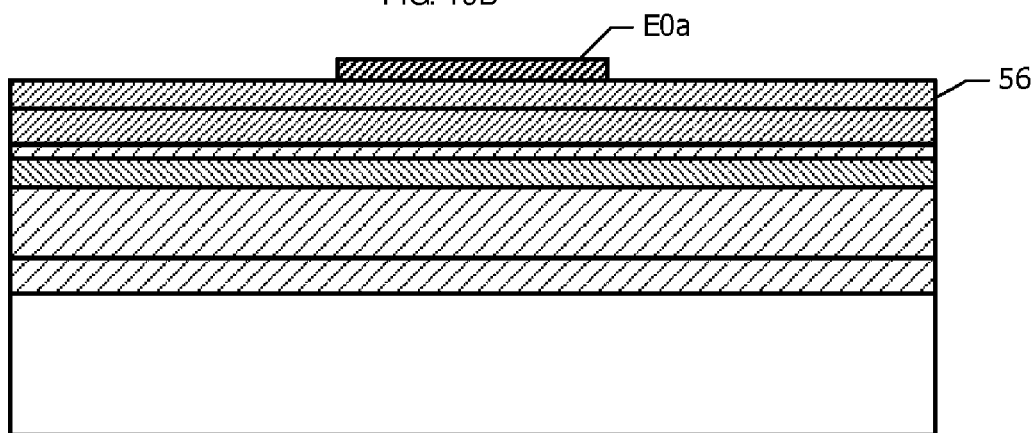

As illustrated in FIG. 19B, an unnecessary portion of the lower layer E0a of the emitter electrode E0 is removed. As a result, the second contact layer 56 is exposed. The etching of the lower layer E0a of the emitter electrode E0 can be conducted by dry etching using $CF_4$.

Figure 19C:
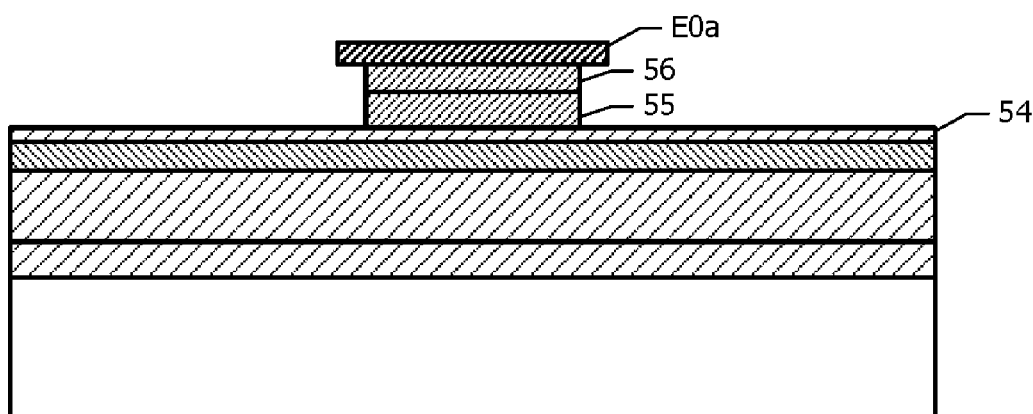

As illustrated in FIG. 19C, unnecessary portions of the second contact layer 56 and the first contact layer 55 are removed by using the lower layer E0a of the emitter electrode E0 as an etching mask. This etching can be conducted under the same conditions as those for the etching in the first embodiment illustrated in FIG. 4B. The emitter layer 54 functions as an etching stopper in this etching. Since the second contact layer 56 and the first contact layer 55 are etched also in the lateral direction, the edges of the second contact layer 56 and the first contact layer 55 are located inside the edge of the lower layer E0a of the emitter electrode E0 in plan view.

Figure 20A:
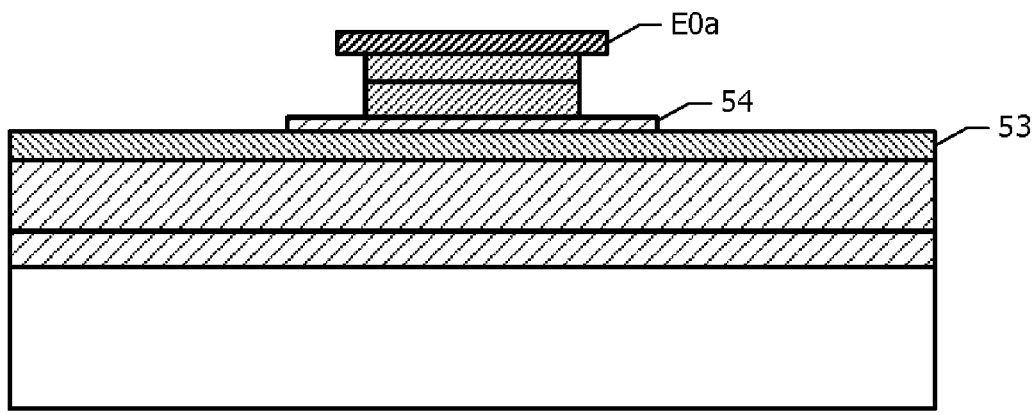
FIGS. 20A, 20B, and 20C are sectional views of an HBT according to the sixth embodiment during its production.

As illustrated in FIG. 20A, an unnecessary portion of the emitter layer 54 is removed. This etching of the emitter layer 54 can be conducted under the same conditions as those for the etching in the first embodiment illustrated in FIG. 4C. In plan view, the emitter layer 54 after the etching includes the lower layer E0a of the emitter electrode E0 inside thereof. The base layer 53 functions as an etching stopper in this etching.

Figure 20B:
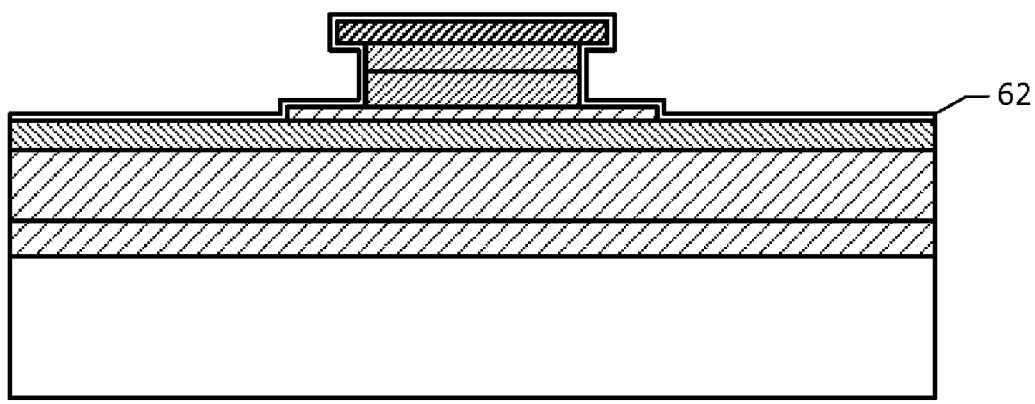
Figure 20C:
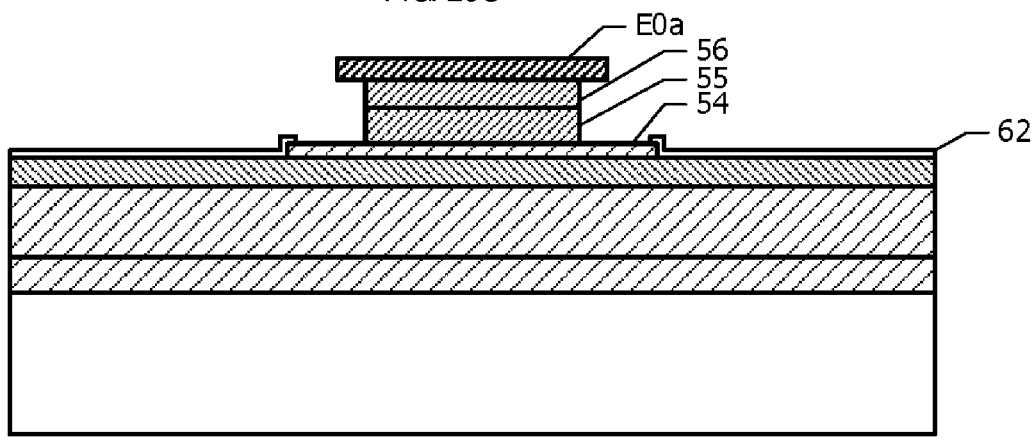

As illustrated in FIG. 20B, an insulating film 62 is deposited over the entire region of the exposed surface. As illustrated in FIG. 20C, an unnecessary portion of the insulating film 62 is removed. Specifically, the insulating film 62 deposited in a region inside the edge of the emitter layer 54 is removed. In reality, the alignment is performed such that the edge of the insulating film 62 is located slightly inside the edge of the emitter layer 54 in consideration of the alignment accuracy of a photoresist film used as an etching mask. The edge of the insulating film 62 is located outside the edge of the lower layer E0a of the emitter electrode E0 in plan view.

Figure 21A:
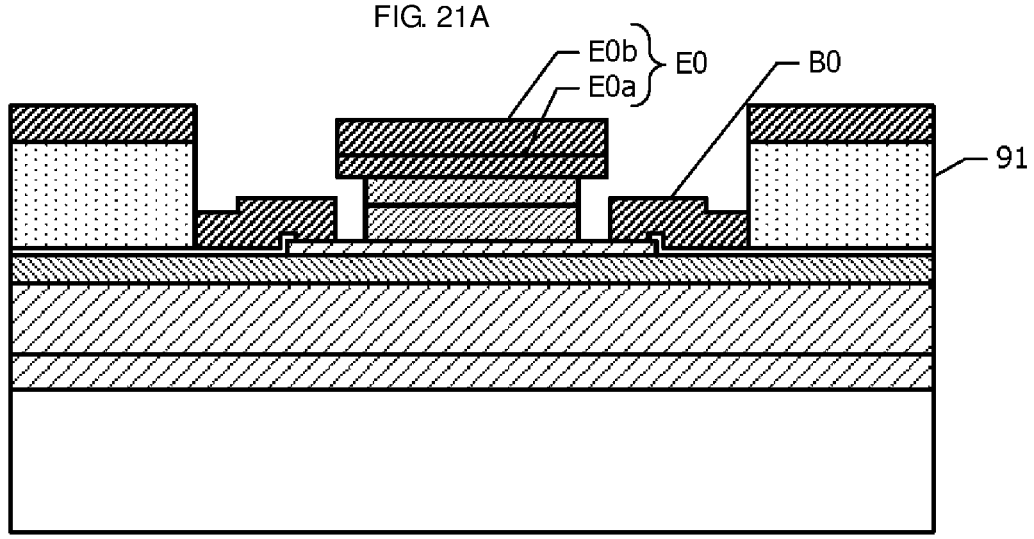
FIGS. 21A, 21B, and 21C are sectional views of an HBT according to the sixth embodiment during its production.

As illustrated in FIG. 21A, a photoresist film 91 is formed outside the outer edge of a base electrode B0 to be formed. The base electrode B0 is formed by vacuum evaporation in this state. The upper layer E0b of the emitter electrode E0, the upper layer E0b having the same layered structure as the base electrode B0, is vapor-deposited on the lower layer E0a. The positions of the inner edge of the base electrode B0 and the edge of the emitter electrode E0 are determined in a self-aligned manner.

Figure 21B:
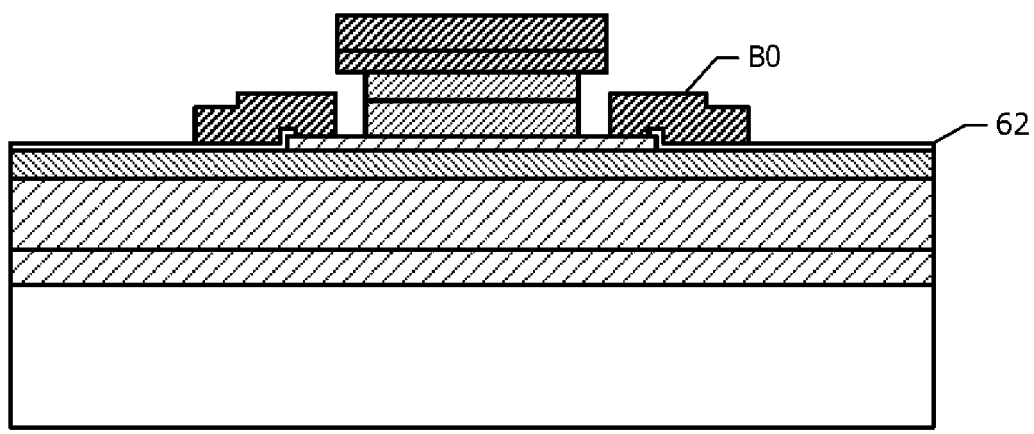

As illustrated in FIG. 21B, the photoresist film 91 (FIG. 21A) is removed together with the metal films deposited thereon. As a result, the insulating film 62 is exposed in a region outside the outer edge of the base electrode B0.

Figure 21C:
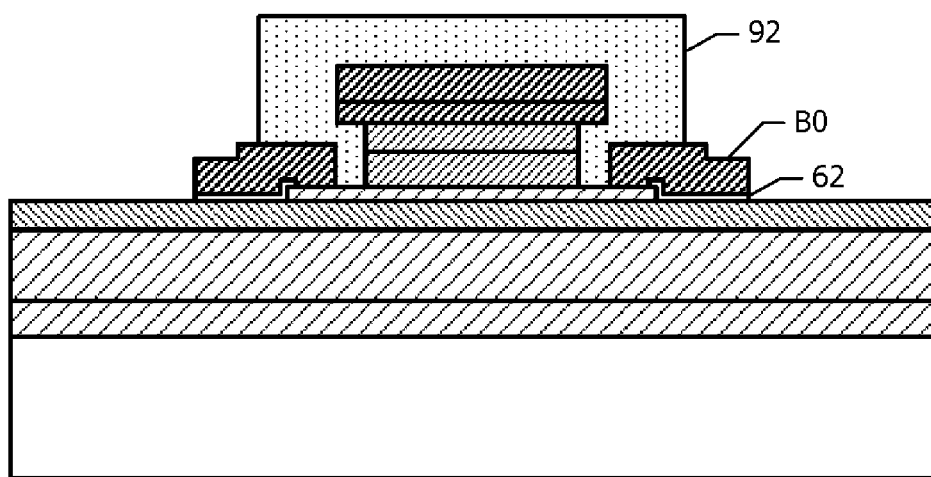

As illustrated in FIG. 21C, a photoresist film 92 having an edge between the outer edge and the inner edge of the base electrode B0 is formed. The insulating film 62 is etched by using the photoresist film 92 and the base electrode B0 as an etching mask. As a result of this etching, the insulating film 62 (FIG. 21B) outside the outer edge of the base electrode B0 is removed, and the insulating film 62 remains under the base electrode B0. The subsequent steps are common to the etching step illustrated in FIG. 6C and the subsequent steps of the first embodiment.

Next, advantageous effects of the HBT according to the sixth embodiment will be described. In the sixth embodiment, an advantageous effect is obtained in that high-speed operation is realized as in the first embodiment. In the first embodiment, as illustrated in FIG. 5C, the gap between the inner edge of the base electrode B0 and the edge of the first contact layer 55 must be designed in consideration of the alignment accuracy of photolithography. In contrast, in the sixth embodiment, the gap between the inner edge of the base electrode B0 and the edge of the first contact layer 55 is substantially equal to the depth of etching of the second contact layer 56 and the first contact layer 55 in the lateral direction in the step illustrated in FIG. 19C. Accordingly, the base electrode B0 can be made close to the first contact layer 55 without being affected by the alignment accuracy of photolithography. The base resistance can be reduced by making the base electrode B0 close to the first contact layer 55.

Modification of Sixth Embodiment

In the sixth embodiment, the insulating film 62 that covers the lower surface of the projecting portion of the base electrode B0 may be removed as in the configuration of the second embodiment (FIGS. 10A, 10B, and 10C).

Seventh Embodiment

Next, an HBT according to a seventh embodiment will be described with reference to FIG. 22. Hereinafter, descriptions of configurations that are common to those of the HBT according to the sixth embodiment (FIGS. 17A to 21C) will be omitted.

Figure 22:
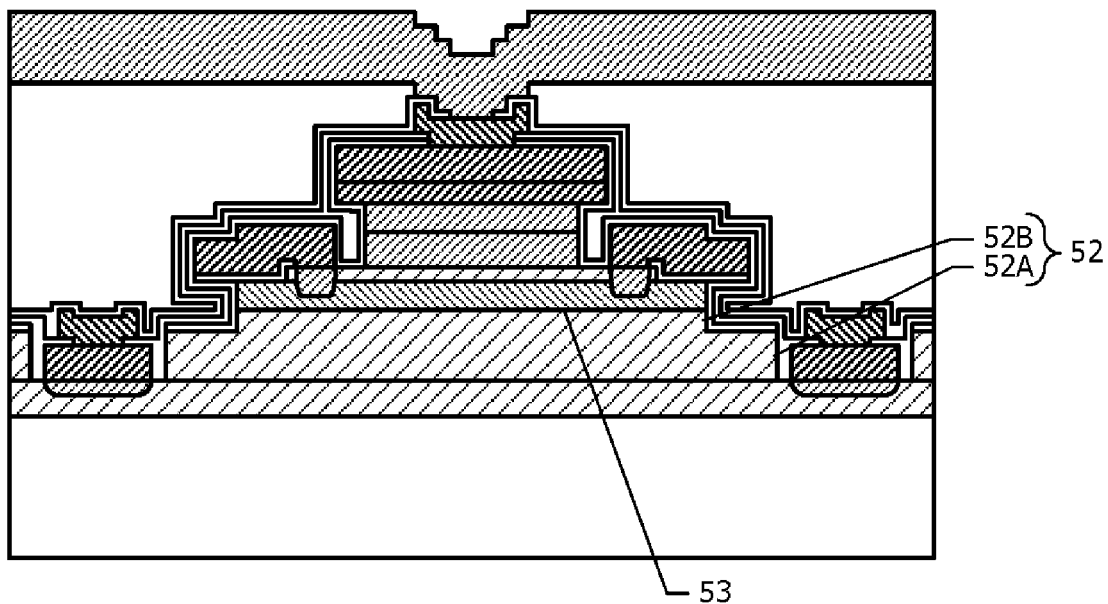
FIG. 22 is a sectional view of an HBT according to a seventh embodiment.

FIG. 22 is a sectional view of an HBT according to the seventh embodiment and corresponds to the sectional view of FIG. 17B according to the sixth embodiment. In the sixth embodiment, the side face of the collector layer 52 (FIG. 17B) coincides with the edge of the base layer 53 in plan view in the range from the lower surface to the upper surface of the collector layer 52. In the seventh embodiment, the edge of an upper collector layer 52B which is an upper portion of a collector layer 52 coincides with the edge of a base layer 53 in plan view, and the edge of a lower collector layer 52A which is a remaining lower portion is located outside the edge of the base layer 53, as in the third embodiment (FIG. 12).

With this configuration of the seventh embodiment, the advantageous effects of the HBT according to the third embodiment are achieved in addition to the advantageous effects of the HBT according to the sixth embodiment.

Modification of Seventh Embodiment

In the seventh embodiment, the insulating film 62 that covers the lower surface of the projecting portion of the base electrode B0 may be removed as in the configuration of the second embodiment (FIGS. 10A, 10B, and 10C).

Eighth Embodiment

Next, an HBT according to an eighth embodiment will be described with reference to FIG. 23. Hereinafter, descriptions of configurations that are common to those of the HBT according to the sixth embodiment (FIGS. 17A to 21C) will be omitted.

Figure 23:
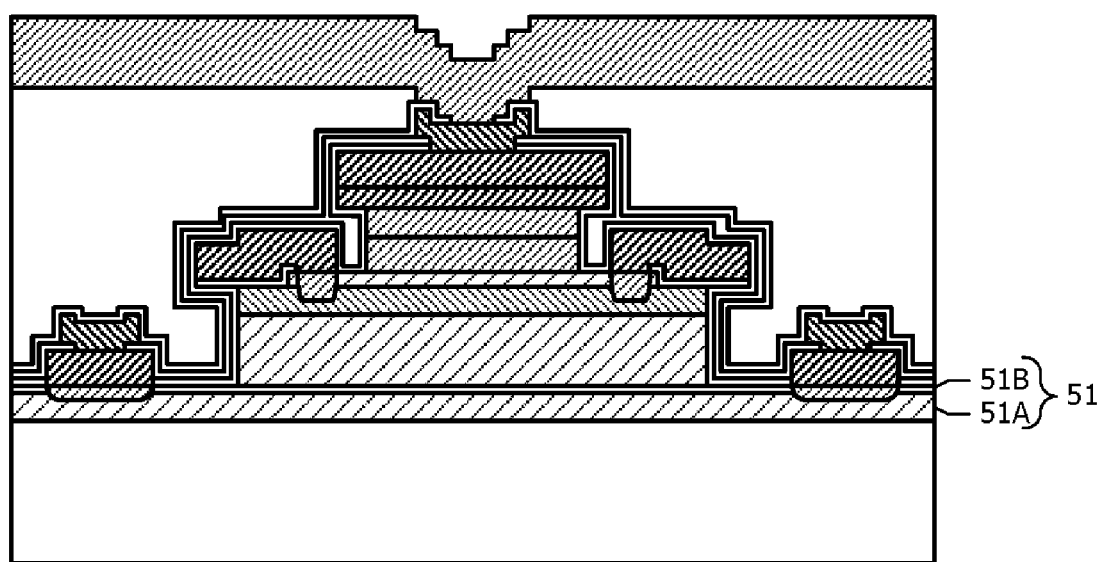
FIG. 23 is a sectional view of an HBT according to an eighth embodiment.

FIG. 23 is a sectional view of an HBT according to the eighth embodiment and corresponds to the sectional view of FIG. 17B according to the sixth embodiment. In the sixth embodiment, the sub-collector layer 51 (FIG. 17B) is formed by a single compound semiconductor layer. In contrast, in the eighth embodiment, a sub-collector layer 51 includes a first sub-collector layer 51A disposed on a substrate 50 and a second sub-collector layer 51B disposed on the first sub-collector layer 51A, as in the fourth embodiment (FIG. 14A).

With this configuration of the eighth embodiment, the advantageous effects of the HBT according to the fourth embodiment are achieved in addition to the advantageous effects of the HBT according to the sixth embodiment.

Modification of Eighth Embodiment

In the eighth embodiment, the insulating film 62 that covers the lower surface of the projecting portion of the base electrode B0 may be removed as in the configuration of the second embodiment (FIGS. 10A, 10B, and 10C).

Ninth Embodiment

Next, an HBT according to a ninth embodiment will be described with reference to FIG. 24. Hereinafter, descriptions of configurations that are common to those of the HBT according to the sixth embodiment (FIGS. 17A to 21C) will be omitted.

Figure 24:
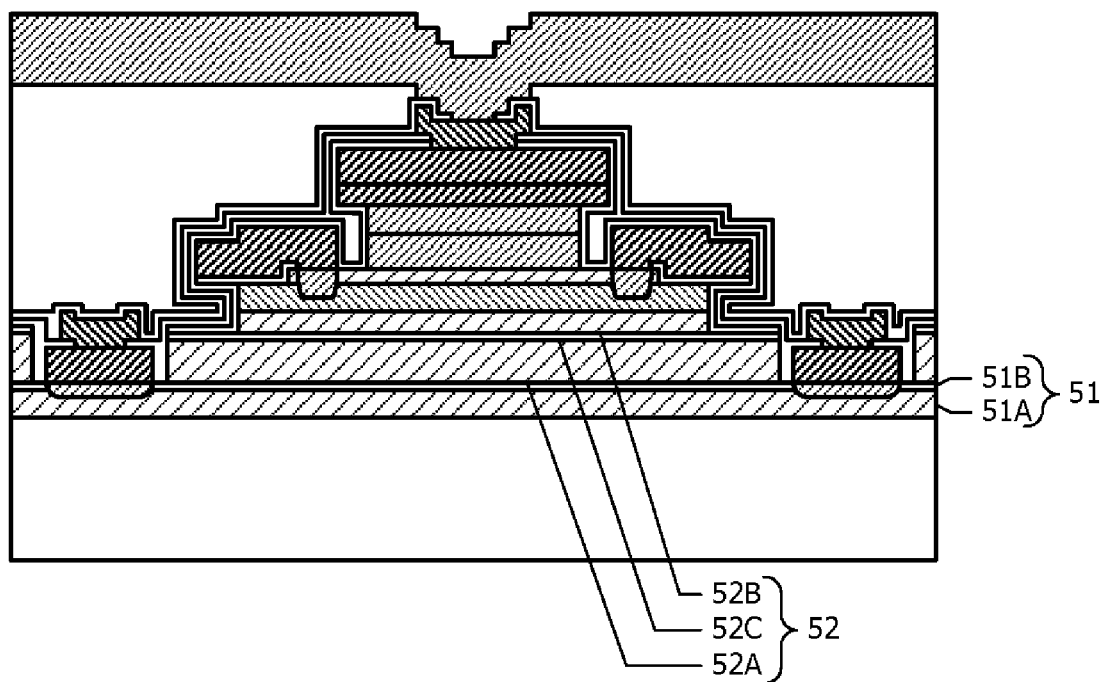
FIG. 24 is a sectional view of an HBT according to a ninth embodiment.

FIG. 24 is a sectional view of an HBT according to the ninth embodiment and corresponds to the sectional view of FIG. 17B according to the sixth embodiment. In the ninth embodiment, a collector layer 52 includes a lower collector layer 52A, an intermediate collector layer 52C, and an upper collector layer 52B as in the fifth embodiment (FIG. 15). Furthermore, a sub-collector layer 51 includes a first sub-collector layer 51A and a second sub-collector layer 51B as in the eighth embodiment (FIG. 23).

With this configuration of the ninth embodiment, the advantageous effects of the HBTs according to the fifth and eighth embodiments are achieved in addition to the advantageous effects of the HBT according to the sixth embodiment.

Modification of Ninth Embodiment

In the ninth embodiment, the insulating film 62 that covers the lower surface of the projecting portion of the base electrode B0 may be removed as in the configuration of the second embodiment (FIGS. 10A, 10B, and 10C).

Tenth Embodiment

Next, an HBT according to a tenth embodiment will be described with reference to FIGS. 25, 26, and 27. Hereinafter, descriptions of configurations that are common to those of the HBT according to the first embodiment (FIGS. 1A to 9C) will be omitted.

Figure 25:
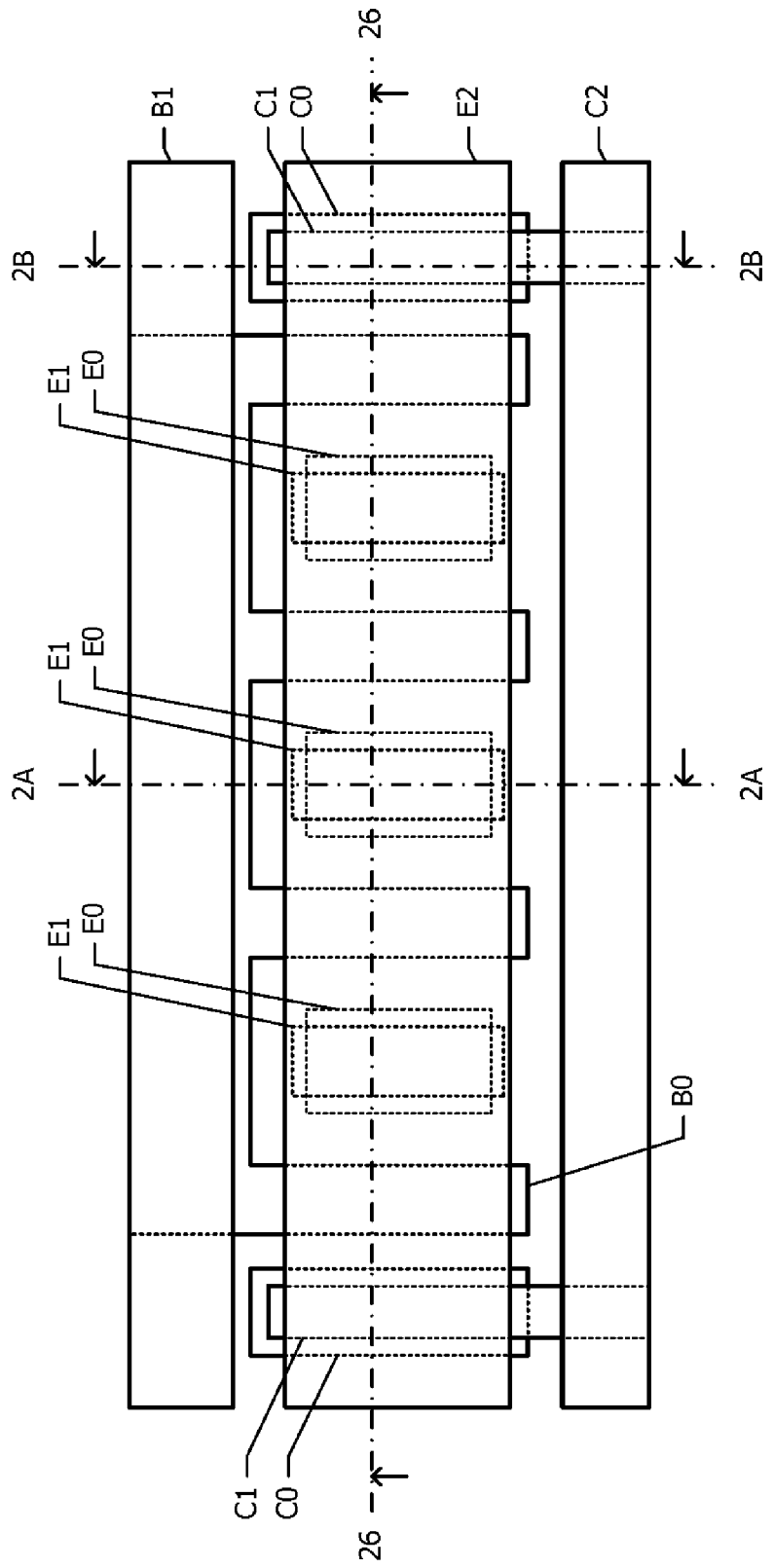
FIG. 25 is a plan view of electrodes connected to a collector, a base, and an emitters of an HBT and wiring lines disposed thereon, according to a tenth embodiment.

FIG. 25 is a plan view of electrodes connected to a collector, a base, and an emitters of an HBT and wiring lines disposed thereon, according to the tenth embodiment. The HBT according to the first embodiment (FIG. 1A) includes one emitter electrode E0. In contrast, the HBT according to the tenth embodiment includes, for example, three emitter electrodes E0. The three emitter electrodes E0 are arranged in a line (in the lateral direction in FIG. 25). A first-layer emitter wiring line E1 is disposed so as to correspond to each of the emitter electrodes E0. The plurality of first-layer emitter wiring lines E1 are connected to a common second-layer emitter wiring line E2.

A base electrode B0 has a comb-teeth-like planar shape. A plurality of tooth portions of the base electrode B0 are disposed between the adjacent emitter electrodes E0 and outside the emitter electrodes E0 on both ends. The plurality of tooth portions are connected together to form the base electrode B0. A first-layer base wiring line B1 is disposed so as to overlap a portion where the tooth portions are connected together.

Collector electrodes C0 are disposed outside the tooth portions on both ends of the base electrode B0. First-layer collector wiring lines C1 are disposed so as to correspond to the collector electrodes C0. The first-layer collector wiring lines C1 are led in a direction orthogonal to the electrode arrangement direction and connected to a second-layer collector wiring line C2.

Figure 26:
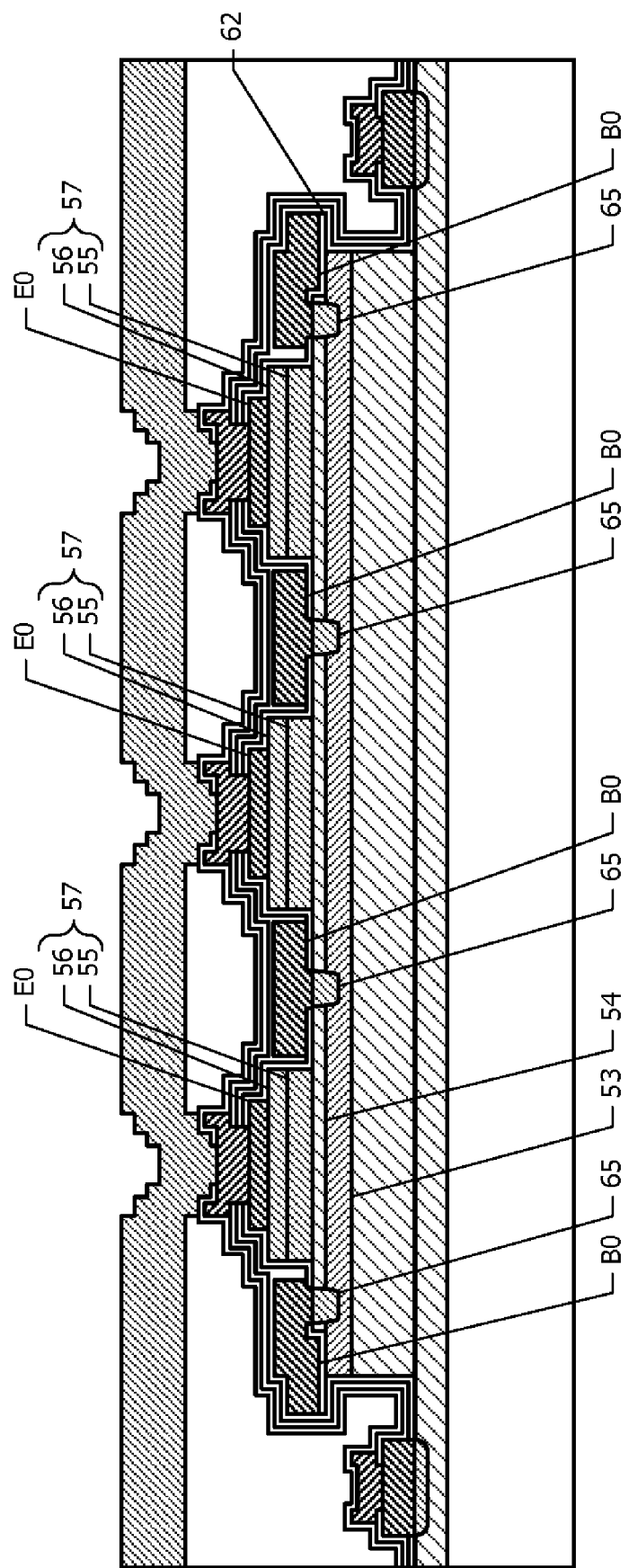
FIG. 26 is a sectional view taken along dash-dotted line 26-26 in FIG. 25.

FIG. 26 is a sectional view taken along dash-dotted line 26-26 in FIG. 25. Three mesa structures 57 each including a first contact layer 55 and a second contact layer 56 are arranged on one emitter layer 54 in an in-plane direction. An emitter electrode E0 is disposed on each of the three mesa structures 57.

Tooth portions of base electrodes B0 are disposed between the adjacent mesa structures 57, and tooth portions of the base electrodes B0 are disposed outside the mesa structures 57 on both ends. A base electrode alloy layer 65 is formed so as to correspond to each of the tooth portions of the base electrode B0. The tooth portions of the base electrode B0 disposed outside the mesa structures 57 on both ends each have a structure projecting outward from the edge of a base layer 53 as in the first embodiment (FIG. 1B). An insulating film 62 is disposed between the base electrode B0 and the base layer 53.

The structures of the sections taken along dash-dotted lines 2A-2A and 2B-2B in FIG. 25 are the same as the structures illustrated in the sectional views of FIGS. 2A and 2B, respectively, of the first embodiment.

Figure 27:
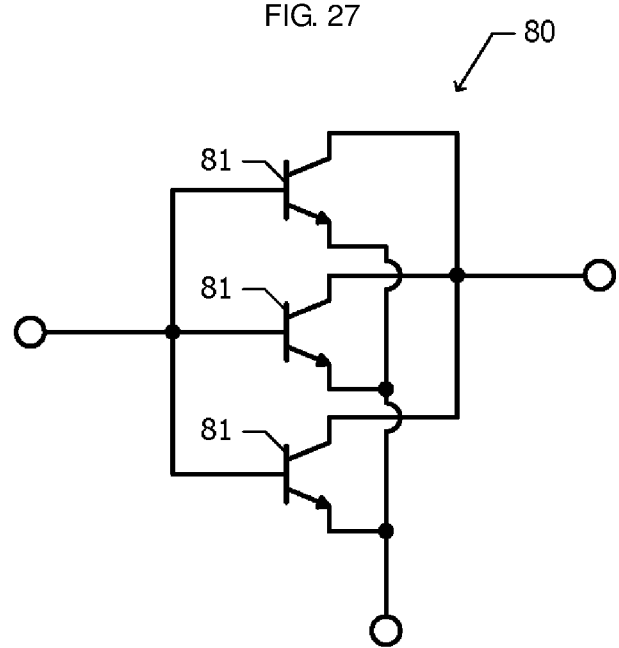
FIG. 27 is an equivalent circuit diagram of an HBT according to the tenth embodiment.

FIG. 27 is an equivalent circuit diagram of an HBT according to the tenth embodiment. An HBT 80 according to the tenth embodiment has a configuration equivalent to a configuration in which the HBT (FIGS. 1A, 1B, 2A, and 2B) according to the first embodiment is used as a unit HBT 81, and three unit HBTs 81 are connected in parallel.

In the tenth embodiment, an advantageous effect is obtained in that high-speed operation of an HBT can be realized by reducing the thickness of the base layer 53 as in the first embodiment.

Modification of Tenth Embodiment

In the tenth embodiment, three unit HBTs 81 (FIG. 27) are connected in parallel. Alternatively, two unit HBTs 81 or four or more unit HBTs 81 may be connected in parallel. In the tenth embodiment, the HBT according to the first embodiment is used as a unit HBT 81, and a plurality of unit HBTs 81 on a single substrate are connected in parallel. Alternatively, each of the HBTs according to the second embodiment to the fifth embodiment may be used as a unit HBT 81, and a plurality of unit HBTs 81 may be connected in parallel as in the tenth embodiment.

In the tenth embodiment, the insulating film 62 that covers the lower surface of the projecting portion of the base electrode B0 may be removed as in the configuration of the second embodiment (FIGS. 10A, 10B, and 10C).

Eleventh Embodiment

Next, an HBT according to an eleventh embodiment will be described with reference to FIGS. 28 and 29. Hereinafter, descriptions of configurations that are common to those of the HBT according to the tenth embodiment (FIGS. 25, 26, and 27) will be omitted.

Figure 28:
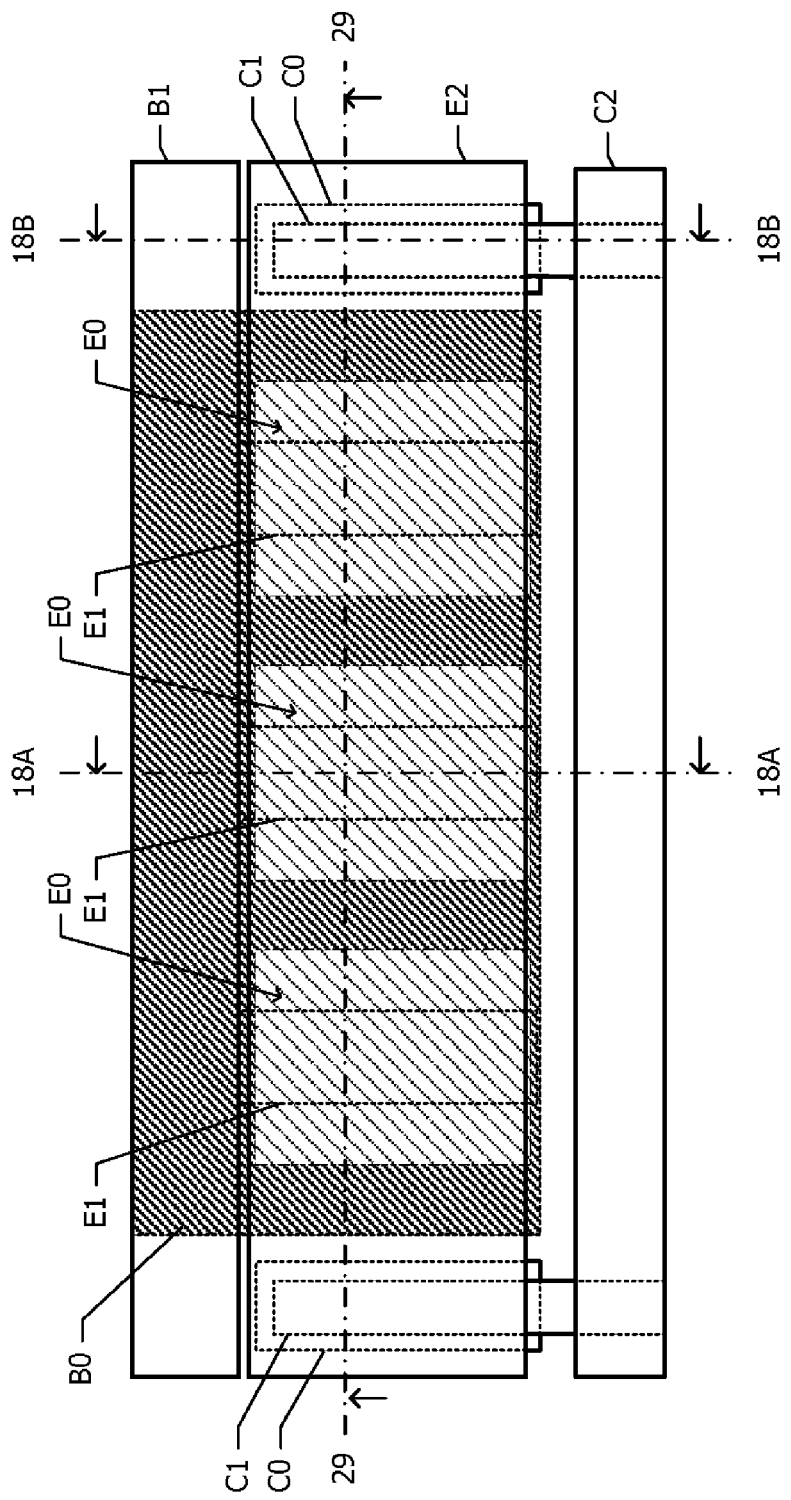
FIG. 28 is a plan view of electrodes connected to a collector, a base, and an emitters of an HBT and wiring lines disposed thereon, according to an eleventh embodiment.

FIG. 28 is a plan view of electrodes connected to a collector, a base, and an emitter of an HBT and wiring lines disposed thereon, according to the eleventh embodiment. In the tenth embodiment, the HBT (FIGS. 1A, 1B, 2A, and 2B) according to the first embodiment is used as the unit HBT 81 (FIG. 27), and a plurality of unit HBTs 81 are connected in parallel. In the eleventh embodiment, the HBT (FIGS. 17A, 17B, 18A, and 18B) according to the sixth embodiment is used as the unit HBT 81.

In the tenth embodiment, the base electrode B0 (FIG. 25) has a comb-teeth-like planar shape. In the eleventh embodiment, a base electrode B0 has a ladder-like planar shape in which leading ends of a plurality of tooth portions are connected together. An emitter electrode E0 is disposed in each of a plurality of regions surrounded by the tooth portions adjacent to each other, a portion that connects bases of the tooth portions together, and a portion that connects leading ends of the tooth portions together. In FIG. 28, the base electrode B0 is densely hatched, and the emitter electrodes E0 are lightly hatched. The arrangement of collector electrodes C0, first-layer collector wiring lines C1, emitter wiring lines E1, a base wiring line B1, a second-layer collector wiring line C2, and a second-layer emitter wiring line E2 is the same as the arrangement of the electrodes and the wiring lines of the tenth embodiment (FIG. 25).

Figure 29:
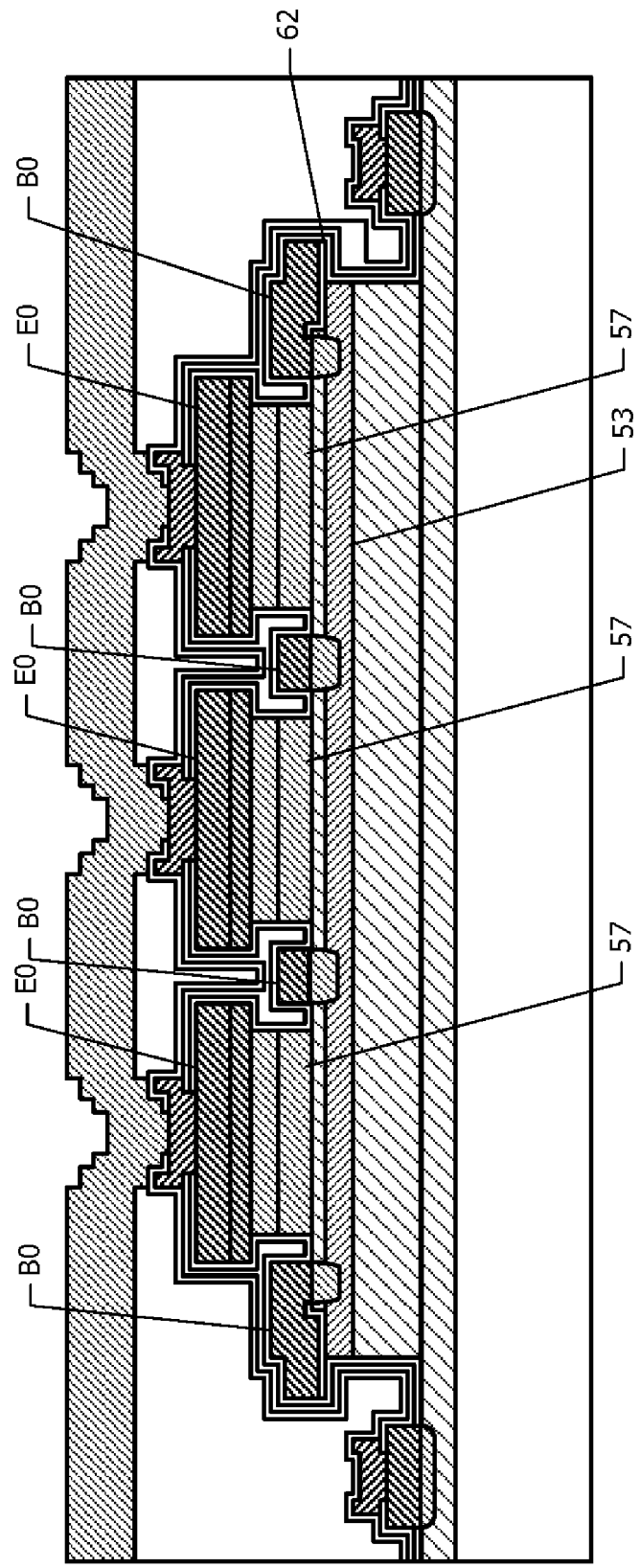
FIG. 29 is a sectional view taken along dash-dotted line 29-29 in FIG. 28.

FIG. 29 is a sectional view taken along dash-dotted line 29-29 in FIG. 28. In the tenth embodiment, each of the emitter electrodes E0 is disposed inside the mesa structure 57 in plan view. In contrast, in the eleventh embodiment, each of the emitter electrodes E0 projects outward from the edge of a mesa structure 57 as in the HBT (FIG. 17B) of the sixth embodiment. Tooth portions of a base electrode B0 are disposed between the adjacent emitter electrodes E0. The edges on both sides of a tooth portion of the base electrode B0 coincide with the edges of the emitter electrodes E0 disposed on both sides of the tooth portion of the base electrode B0 in plan view.

The structure of the tooth portions of base electrode B0 disposed outside the emitter electrodes E0 on both ends is the same as the structure of the base electrode B0 of the HBT (FIG. 17B) of the sixth embodiment. An insulating film 62 is disposed between the base electrode B0 and a base layer 53. The insulating film 62 is not provided in regions inside the inner edges of the tooth portions of the base electrode B0 on both ends.

In the eleventh embodiment, an advantageous effect is obtained in that high-speed operation of an HBT can be realized by reducing the thickness of the base layer 53 as in the sixth embodiment.

Modification of Eleventh Embodiment

In the eleventh embodiment, three unit HBTs 81 (FIG. 27) are connected in parallel. Alternatively, two unit HBTs 81 or four or more unit HBTs 81 (FIG. 27) may be connected in parallel. In the eleventh embodiment, the HBT according to the sixth embodiment is used as a unit HBT 81, and a plurality of unit HBTs 81 on a single substrate are connected in parallel. Alternatively, each of the HBTs according to the seventh embodiment to the ninth embodiment may be used as a unit HBT 81, and a plurality of unit HBTs 81 may be connected in parallel as in the eleventh embodiment.

In the eleventh embodiment, the insulating film 62 that covers the lower surface of the projecting portion of the base electrode B0 may be removed as in the configuration of the second embodiment (FIGS. 10A, 10B, and 10C).

Twelfth Embodiment

A radio-frequency power amplifier module according to a twelfth embodiment will be described with reference to FIGS. 30A and 30B. The radio-frequency power amplifier module according to the twelfth embodiment includes the HBTs according to any of the first embodiment to the eleventh embodiment.

Figure 30A:
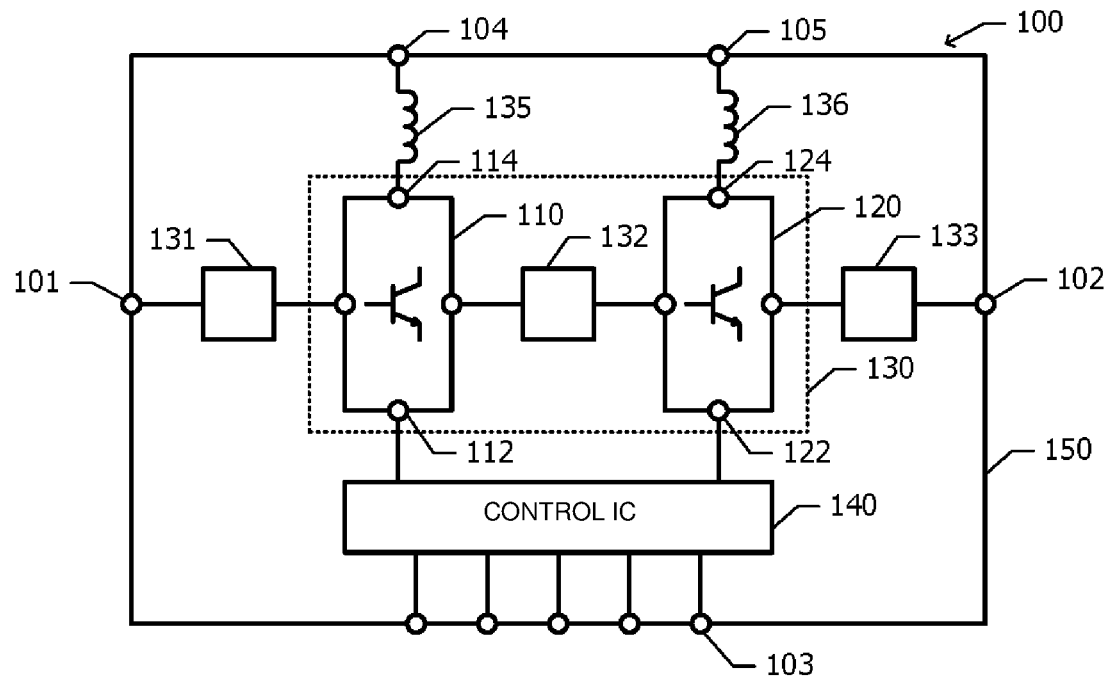
FIG. 30A is a block diagram of a radio-frequency power amplifier module according to a twelfth embodiment.

FIG. 30A is a block diagram of a radio-frequency power amplifier module 100 according to the twelfth embodiment. The radio-frequency power amplifier module 100 according to the twelfth embodiment includes an amplifying IC 130, a control IC 140, inductors 135 and 136, and matching circuits 131 and 133. These elements are mounted on a module substrate 150.

The amplifying IC 130 includes an initial-stage HBT 110, an output-stage HBT 120, and a matching circuit 132 disposed between the initial-stage HBT 110 and the output-stage HBT 120. An RF signal input from an RF input terminal 101 passes through the matching circuit 131, the initial-stage HBT 110, the matching circuit 132, the output-stage HBT 120, and the matching circuit 133 and is output to an RF output terminal 102. A power supply voltage Vcc is applied from power supply terminals 104 and 105 to a collector terminal 114 of the initial-stage HBT 110 and a collector terminal 124 of the output-stage HBT 120 via the inductors 135 and 136, respectively.

A control signal is input from a plurality of control terminals 103 to the control IC 140. The control IC 140 provides a bias terminal 112 of the initial-stage HBT 110 and a bias terminal 122 of the output-stage HBT 120 with a bias signal.

Figure 30B:
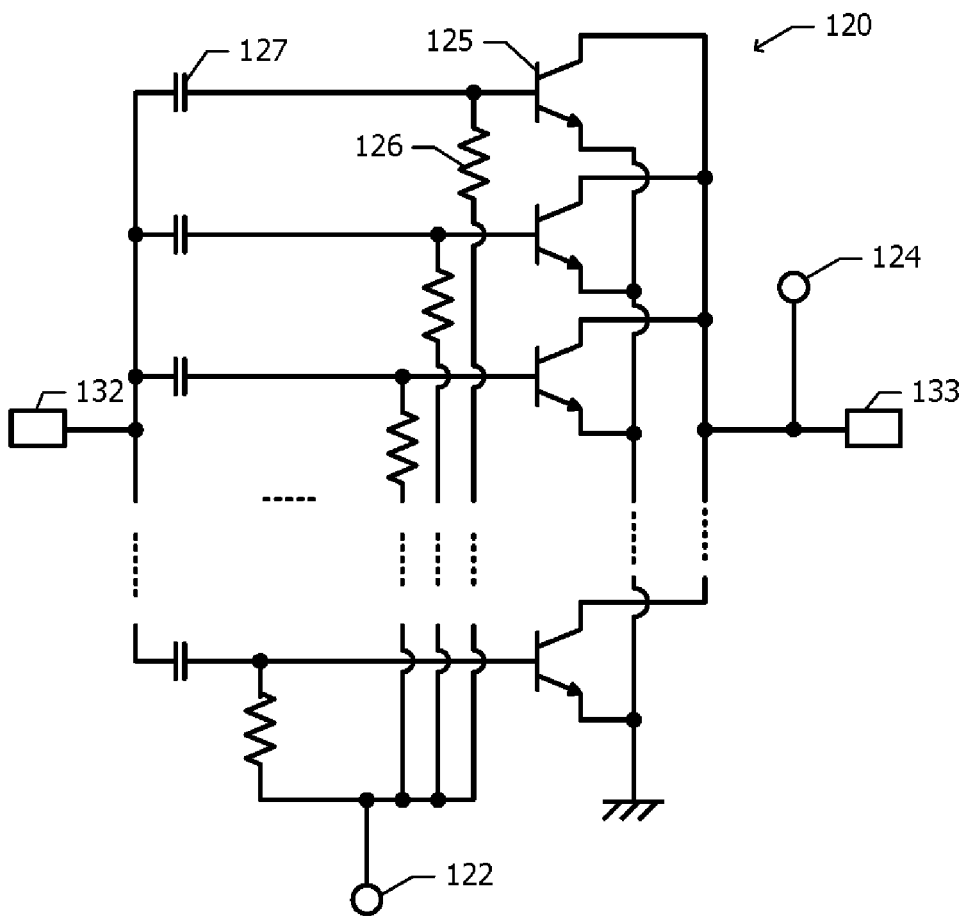
FIG. 30B is an equivalent circuit diagram of an output-stage HBT.

FIG. 30B is an equivalent circuit diagram of the output-stage HBT 120. A plurality of unit HBTs 125 are connected in parallel. The HBT according to any of the first embodiment to the eleventh embodiment is used as each of the unit HBTs 125.

The base of each of the plurality of unit HBTs 125 is connected to a bias terminal 122 with a ballast resistor 126 therebetween. The ballast resistor 126 prevents thermal runaway and protects the unit HBT 125 from breakdown. Furthermore, the base of each of the plurality of unit HBTs 125 is connected to a matching circuit 132 (FIG. 30A) with a DC-cut capacitor 127 therebetween. The DC-cut capacitor 127 is provided for each of the unit HBTs 125 in order to allow the ballast resistor 126 to effectively function. The collector of each of the plurality of unit HBTs 125 is connected to a matching circuit 133 (FIG. 30A) and a collector terminal 124 (FIG. 30A).

The initial-stage HBT 110 also has a circuit configuration similar to the output-stage HBT 120. In general, the number of unit HBTs connected in parallel in the initial-stage HBT 110 is smaller than the number of unit HBTs 125 in the output-stage HBT 120.

The radio-frequency power amplifier module according to the twelfth embodiment includes the HBTs according to any of the first embodiment to the eleventh embodiment. Therefore, high-speed operation can be realized by reducing the thickness of the base layer of each of the HBTs.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bipolar transistor comprising:
   a collector layer formed on a substrate made of a compound semiconductor;
   a base layer formed on the collector layer;
   an emitter layer formed on the base layer;
   a base electrode having one portion disposed on a partial region of the emitter layer and an other portion extended towards an edge of the base layer in plan view above the emitter layer and the base layer; and
   an insulating film disposed between the other portion of the base electrode and a portion of the emitter layer and the base layer.

2. The bipolar transistor according to claim 1, wherein the base electrode projects outward from an edge of the collector layer.

3. The bipolar transistor according to claim 1, wherein the base electrode projects outward from an edge of the base layer.

4. The bipolar transistor according to claim 1, further comprising
   an alloy layer that extends from the one portion of the base electrode through the emitter layer in a thickness direction and reaches the base layer.

5. The bipolar transistor according to claim 4, wherein the alloy contains at least one element constituting the base electrode, and elements constituting the emitter layer and the base layer.

6. The bipolar transistor according to claim 1, wherein a portion of the base layer does not overlap the emitter layer.

7. The bipolar transistor according to claim 1, wherein
a side face of an upper portion of the collector layer is continuous with a side face of the base layer, and
a side face of a remaining lower portion of the collector layer is located outside the side face of the base layer.

8. The bipolar transistor according to claim 1, wherein
the collector layer includes an intermediate collector layer that is disposed at an intermediate position in a thickness direction and made of a semiconductor material having etching characteristics different from etching characteristics of a semiconductor material of another portion of the collector layer,
a side face of an upper portion of the collector layer disposed on the intermediate collector layer is continuous with a side face of the base layer, and
a side face of a lower portion of the collector layer disposed under the intermediate collector layer is located outside the side face of the base layer.

9. The bipolar transistor according to claim 1, further comprising:
a sub-collector layer disposed between the substrate and the collector layer,
wherein
the sub-collector layer includes a first sub-collector layer disposed on the substrate and a second sub-collector layer disposed on the first sub-collector layer, and
the second sub-collector layer has etching characteristics different from etching characteristics of a portion of the collector layer, the portion being in contact with the second sub-collector layer.

10. The bipolar transistor according to claim 1, further comprising:
a contact layer disposed on a partial region of the emitter layer; and
an emitter electrode disposed on the contact layer and projecting outward from an edge of the contact layer,
wherein a leading end of a projecting portion of the emitter electrode coincides with an edge of the base electrode in plan view.

11. The bipolar transistor according to claim 1, further comprising
a contact layer disposed on a partial region of the emitter layer;
wherein
the contact layer comprises a plurality of semiconductor layers arranged on an upper surface of the emitter layer in an in-plane direction, and
the base electrode includes a portion disposed between the plurality of semiconductor layers that form the contact layer.

12. The bipolar transistor according to claim 11, wherein
one portion of the base electrode disposed between the plurality of semiconductor layers is disposed on a partial region of the emitter layer, and
an other portion of the base electrode disposed between the plurality of semiconductor layers extends towards an edge of the plurality of semiconductor layers in plan view above the emitter layer and the base layer; and
the bipolar transistor further comprises an insulating film disposed between the other portion of the base electrode disposed between the plurality of semiconductor layers and a portion of the emitter layer and the base layer.

13. The bipolar transistor according to claim 1, further comprising:
a plurality of emitter electrodes connected to the emitter layer and arranged in an in-plane direction,
wherein the base electrode includes a portion disposed between the emitter electrodes.

14. The bipolar transistor according to claim 13, wherein
one portion of the base electrode disposed between the emitter electrodes is disposed on a partial region of the emitter layer, and
and an other portion of the base electrode disposed between the emitter electrodes extends towards an edge of the emitter electrodes in plan view above the emitter layer and the base layer; and
the bipolar transistor further comprises an insulating film disposed between the other portion of the base electrode and a portion of the emitter layer and the base layer.

15. The bipolar transistor according to claim 1, wherein
the base layer has a length extending in a longitudinal direction and a width extending in a lateral direction perpendicular to the longitudinal direction, and
the base electrode extends towards an edge of the base layer in plan view above the emitter layer and the base layer for substantially the entire length of the base.

16. A radio-frequency power amplifier module comprising:
an amplifying IC including a bipolar transistor, the bipolar transistor including
a collector layer formed on a substrate made of a compound semiconductor;
a base layer formed on the collector layer;
an emitter layer formed on the base layer;
a base electrode having one portion disposed on a partial region of the emitter layer and an other portion extended towards an edge of the base layer in plan view above the emitter layer and the base layer; and
an insulating film disposed between the other portion of the base electrode and a portion of the emitter layer and the base layer; and
a control IC that controls operation of the bipolar transistor.

17. The radio-frequency power amplifier module according to claim 16, wherein
the base layer has a length extending in a longitudinal direction and a width extending in a lateral direction perpendicular to the longitudinal direction, and
the base electrode extends towards an edge of the base layer in plan view above the emitter layer and the base layer for substantially the entire length of the base.

18. The radio-frequency power amplifier module according to claim 16, wherein
the base electrode projects outward from an edge of the collector layer.

19. The radio-frequency power amplifier module according to claim 16, wherein
the base electrode projects outward from an edge of the base layer.

20. The radio-frequency power amplifier module according to claim 16, wherein the bipolar transistor further comprises an alloy layer that extends from the one portion of the base electrode through the emitter layer in a thickness direction and reaches the base layer.

\* \* \* \* \*